United States Patent [19]
Uno et al.

[11] Patent Number: 5,619,486
[45] Date of Patent: Apr. 8, 1997

[54] STORAGE DISK MODULE AND STORAGE DISK DEVICE HAVING A PLURALITY OF STORAGE DISK MODULES

[75] Inventors: Hirosi Uno; Takao Hakamatani, both of Kawasaki, Japan

[73] Assignee: Fujitsu Limited, Kawasaki, Japan

[21] Appl. No.: 428,353

[22] Filed: Apr. 21, 1995

Related U.S. Application Data

[62] Division of Ser. No. 258,594, Jun. 10, 1994, Pat. No. 5,485,446, which is a continuation of Ser. No. 799,610, Nov. 27, 1991, abandoned.

[30] Foreign Application Priority Data

| Nov. 30, 1990 | [JP] | Japan | 2-334161 |
| Feb. 14, 1991 | [JP] | Japan | 3-42578 |
| Feb. 22, 1991 | [JP] | Japan | 3-50679 |
| Mar. 1, 1991 | [JP] | Japan | 3-59321 |
| Mar. 1, 1991 | [JP] | Japan | 3-59322 |

[51] Int. Cl.⁶ ............................................. G11B 33/12
[52] U.S. Cl. ............................ 369/75.1; 360/97.02; 360/137
[58] Field of Search ......................... 369/75.1, 75.2, 369/77.1, 77.2, 69, 292; 360/97.02, 97.03, 97.04, 97.01, 98.01, 137; 361/679, 683, 684, 685, 687, 688, 690, 695, 727

[56] References Cited

FOREIGN PATENT DOCUMENTS 03237675  10/1991  Japan .................................. 360/97.02

*Primary Examiner*—Stuart S. Levy
*Assistant Examiner*—Paul J. Ditmyer
*Attorney, Agent, or Firm*—Staas & Halsey

[57] ABSTRACT

A storage disk module includes a frame, and a disk drive unit having a storage disk. The disk drive unit is accommodated in the frame. A circuit unit controls the disk drive unit, and is accommodated in the frame. A power source supplies the disk drive unit and the circuit unit with energy. The power source is accommodated in the frame. The disk drive unit, the circuit unit and the power source are arranged side by side in the frame in a direction perpendicular to a direction in which the storage disk module is inserted into a locker. A back panel is formed in a back portion of the frame. The back panel electrically connects the disk drive unit, the circuit unit and the power source to each other.

25 Claims, 38 Drawing Sheets

FIG. 13
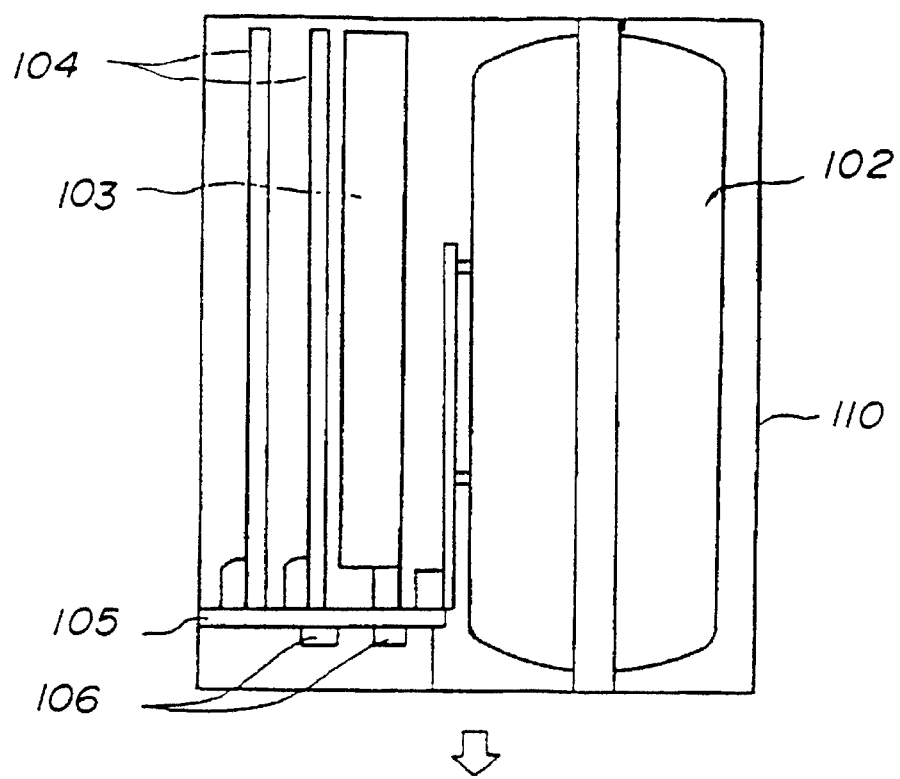
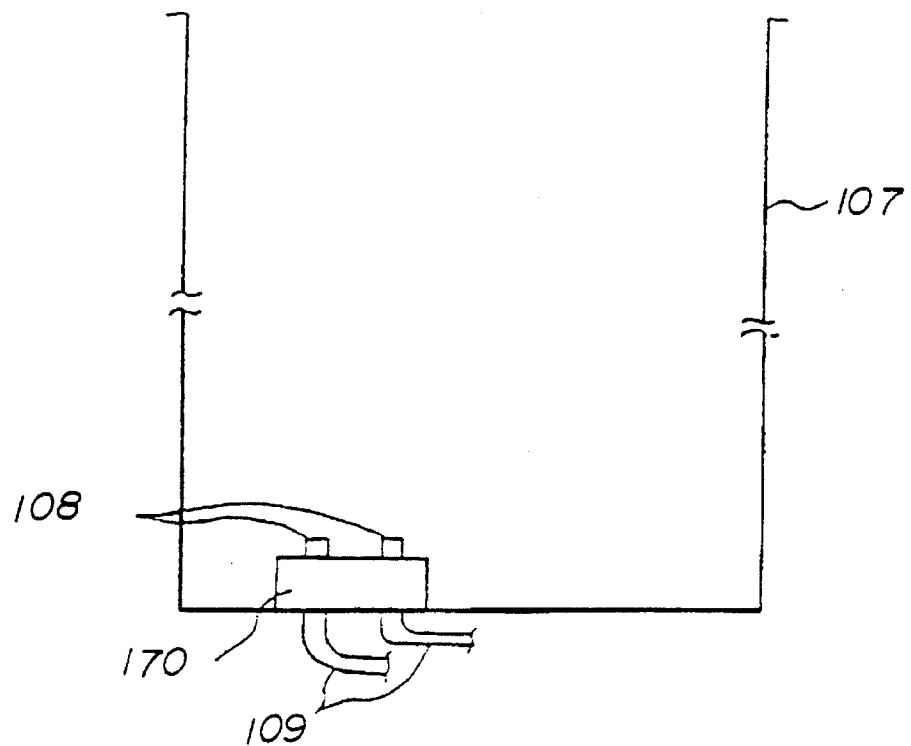

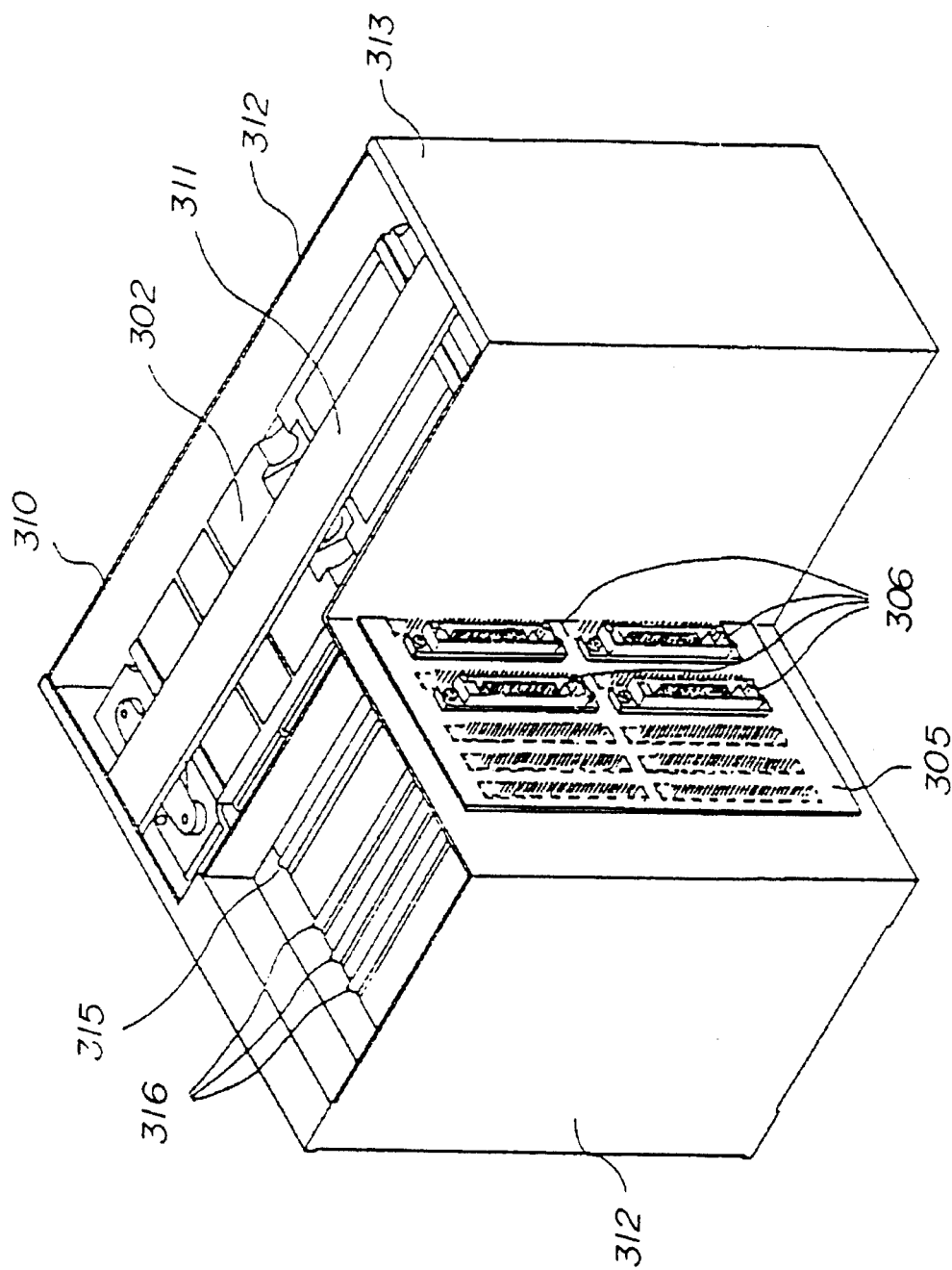

STORAGE DISK MODULE AND STORAGE DISK DEVICE HAVING A PLURALITY OF STORAGE DISK MODULES

This application is a division of application Ser. No. 08/258,594, filed Jun. 10, 1994 now U.S. Pat. No. 5,485,446 which is a continuation of application Ser. No. 07/799,610, filed Nov. 27, 1991, abandoned.

BACKGROUND OF THE INVENTION (1) Field of the Invention

The present invention generally relates to a storage disk module which includes a storage disk drive unit, a power source, a circuit unit, all of which are accommodated in a frame. Further, the present invention is concerned with a storage disk device having such storage disk modules.

(2) Description of the Prior Art

Storage disk devices, such as magnetic disk devices and optical disk devices are widely used in computer systems, as external storage devices. Recently, computer systems have been equipped with storage disk devices having a large storage capacity. A conventional storage disk device has a plurality of storage disk modules accommodated in a frame of the storage disk device.

FIG. 1 is a perspective view of a conventional storage disk module 6, which is composed of a disk drive unit 3, a power source 4, a circuit unit 5, all of which are accommodated in a frame 1. The disk drive unit 3 positions heads with respect to storage disks by using an access mechanism. The circuit unit 5 controls the the operation of the disk drive unit 3.

The storage disk module 6 is disclosed in Japanese Laid-Open Patent Publication No. 1-88529 filed Apr. 7, 1989. The structural elements of the storage disk module 6 are arranged as follows. The disk drive unit 3 is fixed to a rear portion of frame 1. The power source 4 and the circuit unit 5 are provided in a front portion of the frame 1. Cables electrically connect the disk drive unit 3, the power source 4 and the circuit unit 5 to each other.

Upper and lower portions of the module 6 are open. With this structure, it becomes possible to effectively cool the entire module 6 by a cooling flow, as indicated by arrows, and to perform a maintenance operation on the power source 4 and the circuit unit 5 from the front side of the module 6.

However, the conventional storage disk module 6 shown in FIG. 1 has a disadvantage in that laying the above-mentioned connection cables requires a large area which prevents an increase in the mounting density. A further disadvantage is that the storage disk module 6 must be forwardly drawn and the connection cables must be detached from the structural elements in order to replace the disk drive unit 3 with a new one.

SUMMARY OF THE INVENTION

An object of the present invention is to provide a storage disk module, which has an arrangement, which makes it possible to cool the inside thereof effectively and to easily replace the structural elements with new ones.

This object of the present invention is achieved by a storage disk module comprising: a frame; a disk drive unit having a storage disk, the disk drive unit being accommodated in the frame; a circuit unit for controlling the disk drive unit, the circuit unit being accommodated in the frame; a power source for supplying the disk drive unit and the circuit unit with energy, the power source being accommodated in the frame, and the disk drive unit, the circuit unit and the power source being arranged side by side in the frame in a direction perpendicular to a direction in which the storage disk module is inserted into a locker; and a back panel formed in a back portion of the frame, the back panel electrically connecting the disk drive unit, the circuit unit and the power source to each other.

Another object of the present invention is to provide a storage disk device including a plurality of storage disk modules, each of which has the above-mentioned structure.

This object of the present invention is achieved by a storage disk device comprising: a locker; and a plurality of storage disk modules accommodated in the locker. Each of the storage disk modules is configured as described above.

BRIEF DESCRIPTION OF THE DRAWINGS

Other objects, features and advantages of the present invention will become apparent from the following detailed description if read in conjunction with the accompanying drawings, in which:

FIG. 13 is a plan view showing an outline of a second embodiment of the present invention;

FIG. 26 is a perspective view of the storage disk module according to the third embodiment of the present invention;

DESCRIPTION OF THE PREFERRED EMBODIMENTS

Figure 1:
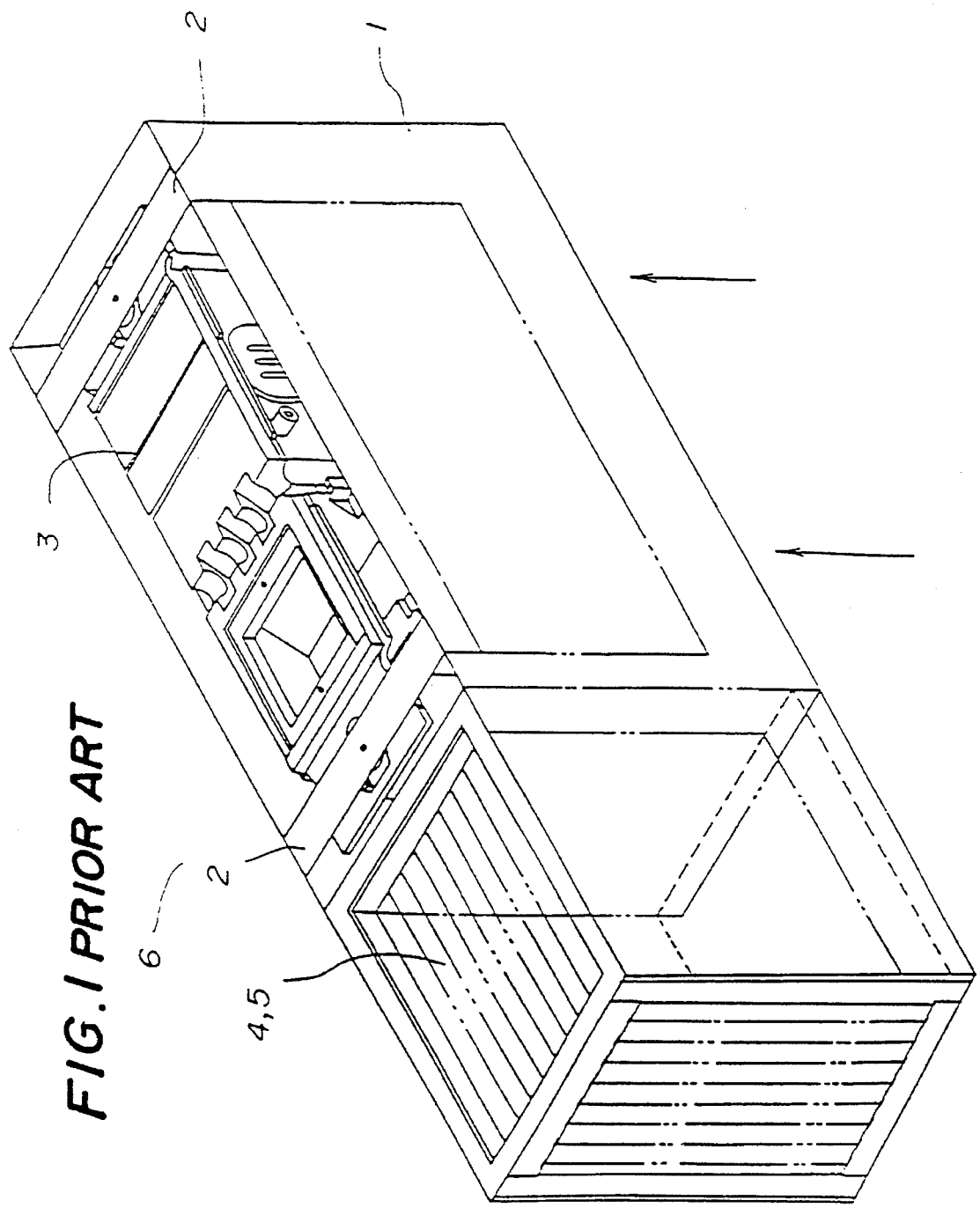
FIG. 1 is a perspective view of a conventional storage disk module.
Figure 2A:
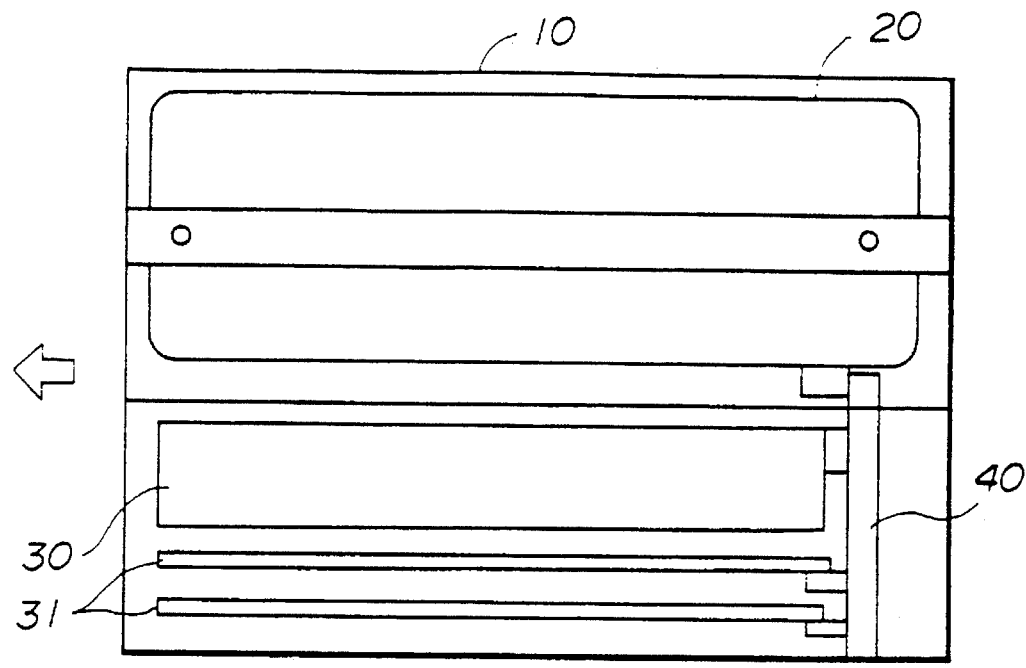
FIG. 2A is a plan view showing an outline of a first embodiment of the present invention.
Figure 2B:
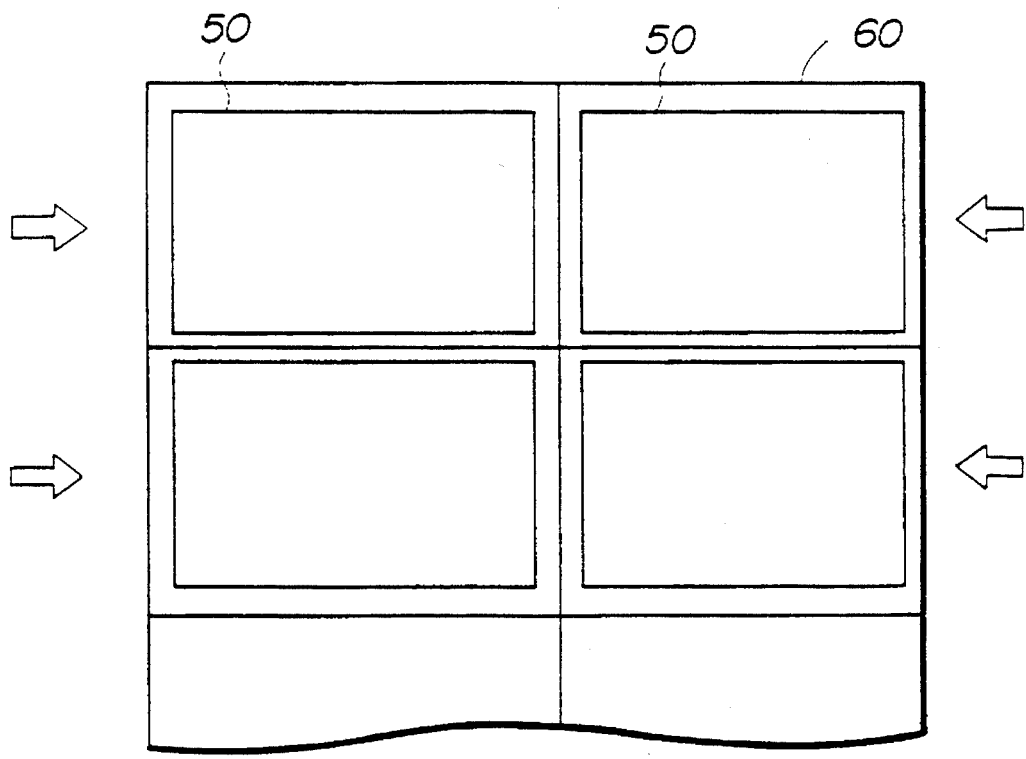
FIG. 2B is a plan view showing an outline of a storage disk device having a plurality of storage disk modules, each of which has a structure shown in FIG. 2A.

FIGS. 2A and 2B are diagrams showing an outline of a first embodiment of the present invention. A storage disk module 50 shown in FIGS. 2A and 2B includes a disk drive unit 20 for positioning heads by means of an access mechanism, a power source 30, a circuit unit 31 for controlling the operation of the disk drive unit 20, all of which are accommodated in a frame 10. A back panel 40 is provided at a rear portion of the frame 10. The disk drive unit 20 and the power source 30 are arranged side by side in the frame 10. The disk drive unit 20, the power source 30 and the circuit unit 31 are electrically and mechanically connected to each other through the back panel 40. It should be noted that the above-mentioned connection cables are not used in the structure shown in FIGS. 2A and 2B. With this arrangement, it becomes possible to make the storage disk module 50 compact and increase the mounting density. Further, it becomes possible to have access to the disk drive unit 20, the power source 30 and the circuit unit 31 from the front side of the storage disk module 50. As a result, as shown in FIG. 2B, it becomes possible to arrange two storage disk modules 50 so that back surfaces thereof are opposed to each other.

Figure 3:
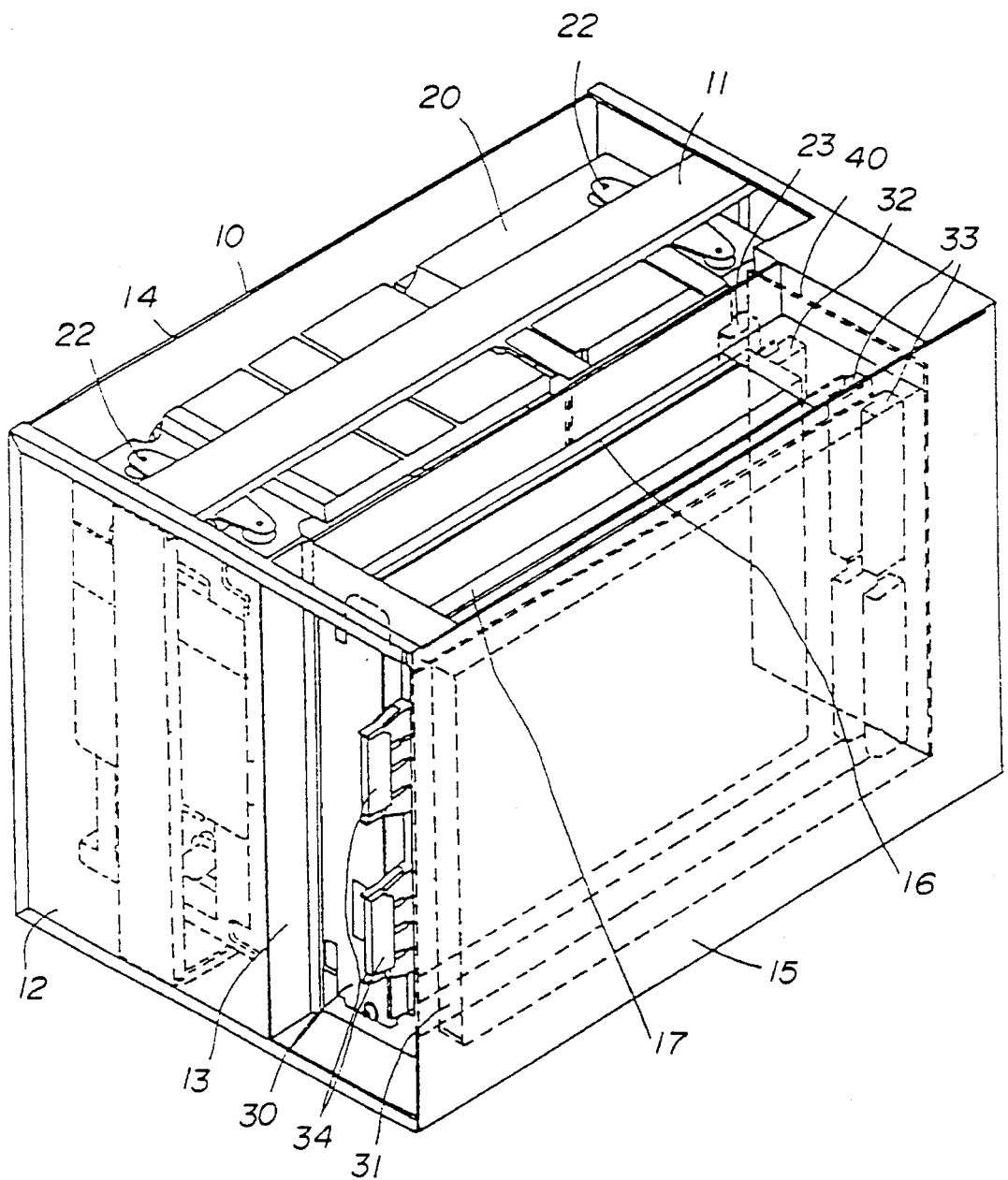
FIGS. 3 and 4 are perspective views of the storage disk module according to the first embodiment of the present invention.
Figure 4:
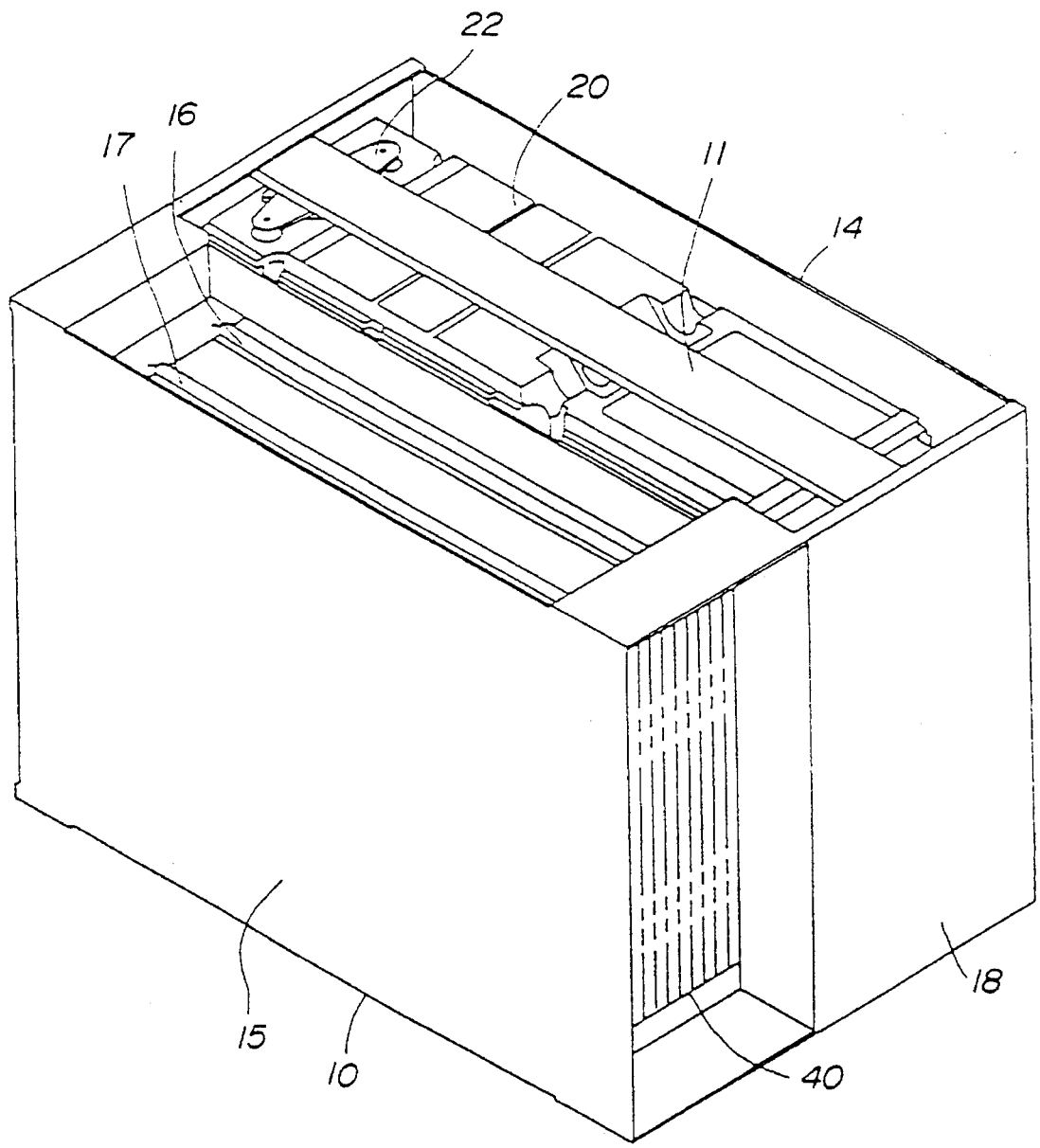

As shown in FIG. 3, a pair of side plates 14 and 15 are provided on both sides of the frame 10. A partition plate 13 is provided at an intermediate position in the frame, so that a disk drive unit accommodating part and a circuit accommodating part are formed. Guide members (rails) 11 are provided on upper and lower portions of the disk drive unit accommodating part. As shown in FIG. 4, a back plate 18 is provided at a back portion of the disk drive unit accommodating part.

As shown in FIG. 4, a back panel 40 is provided in the circuit accommodating part so that the back panel 40 is exposed. A guide member 16 for the power source 40 and a guide member 17 for a printed circuit board are provided at upper and lower portions of the circuit accommodating part. The side surfaces of the frame 10 are covered except for the front surface into which the unit is inserted. In a state where the unit has been inserted, the front surface of the frame 10 is closed by the unit. The upper and lower portions of the frame 10 are open. With this arrangement, the cooling air upwardly passes through the inside of the frame 10, and hence cooling can be effectively performed.

The disk drive unit accommodating part and the circuit accommodating part are arranged side by side in the frame 10. Hence, it becomes possible to arrange the disk drive unit 20 and the power source 30 side by side in a direction perpendicular to a direction in which they are inserted into the frame 10.

Figure 6:
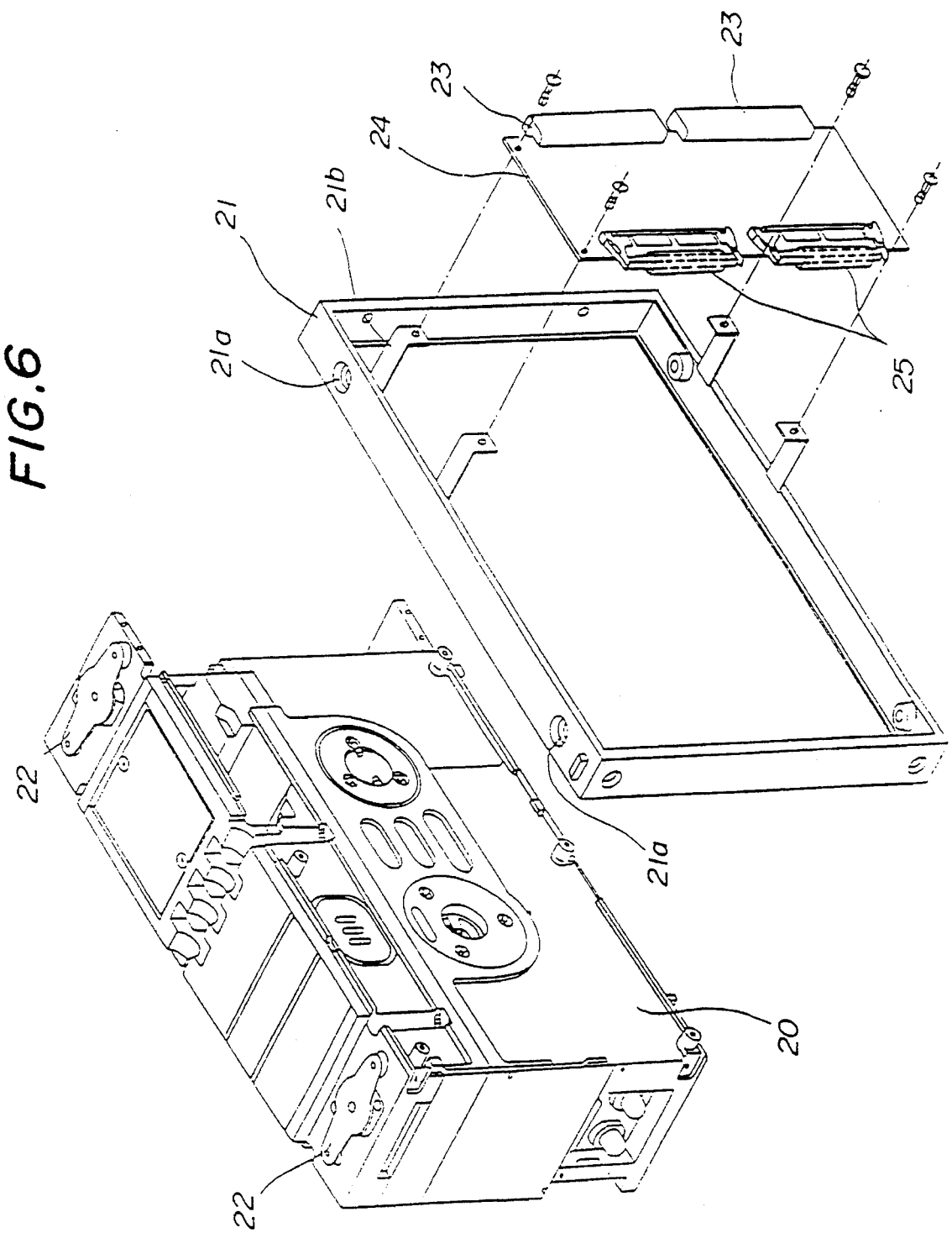
FIG. 6 is an exploded perspective view of a disk drive unit used in the first embodiment of the present invention.

As shown in FIG. 6, rubber members 22 for absorbing vibrations of the disk drive unit 20 are fixed to upper and lower portions of the disk drive unit 20 at the front and rear ends thereof by means of screws. A disk drive frame 21 of the disk drive unit 20 has screw holes 21a and attachment arms 21b. A printed circuit board 24 has a preamplifier, a reproduction circuit and so on. Connectors 23 are provided on the right side of the printed circuit board 24, and cables 25 for connecting the printed circuit board 24 to the disk drive unit 20 are provided on the left side of thereof. The printed circuit board 24 is secured to the attachment arms 21b by screws, which penetrate holes formed at corner portions of the printed circuit board 24. It is preferable that the holes formed in the printed circuit board 24 have sizes which are slightly greater than the diameters of the screws. The printed circuit board 24 is free to slightly move. With this arrangement, it becomes possible to absorb vibrations of the disk drive unit 20 and definitely connect the connectors 23 to the back panel 40.

The frame 21 is positioned around the disk drive unit 20 so that the screw holes 21a are opposed to the rubber members 22. Screws passing through the screw holes 21 engage with corresponding holes formed in the rubber members 22.

Figure 5:
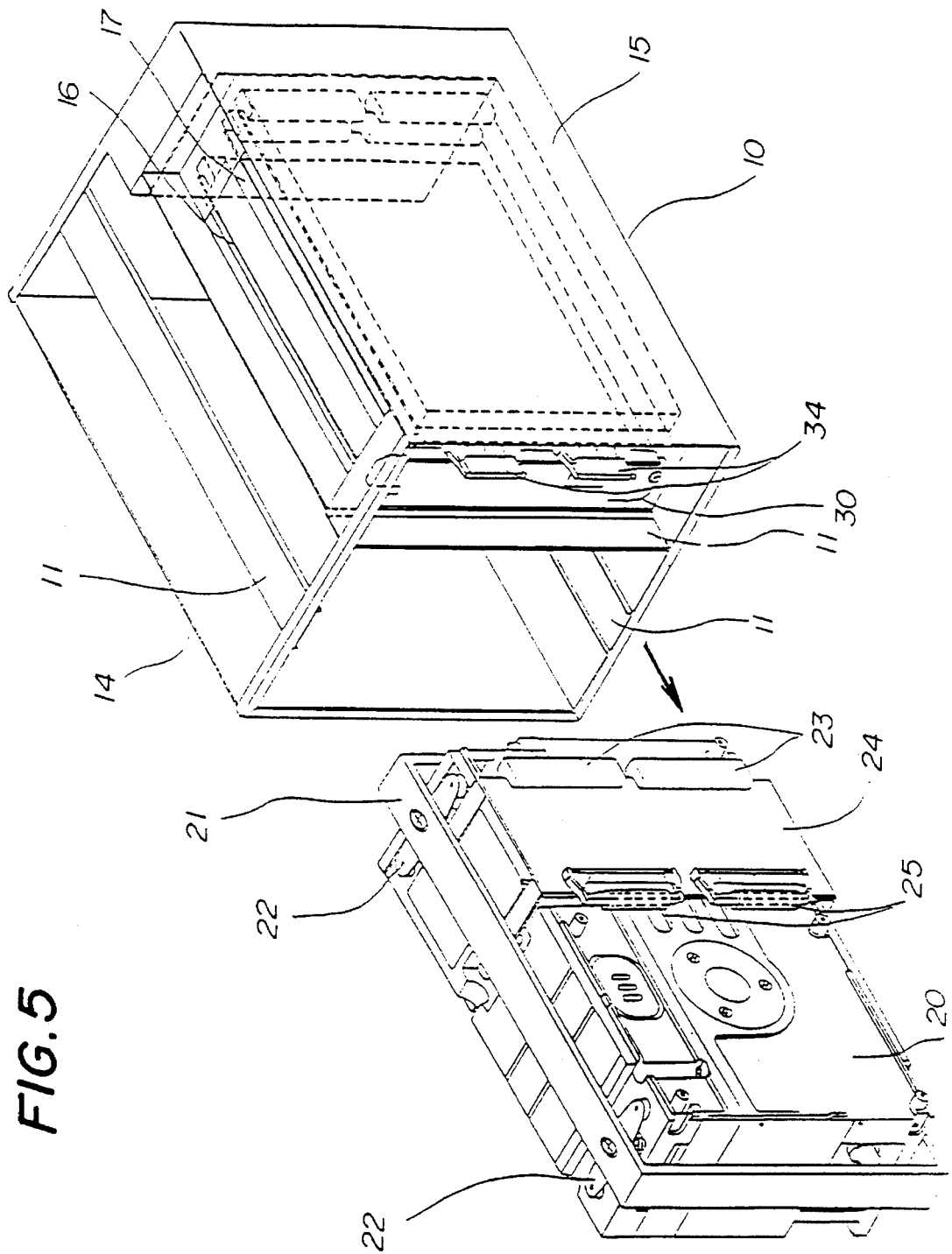
FIG. 5 is an exploded perspective view of the storage disk module according to the first embodiment of the present invention.

As shown in FIG. 5, the disk drive unit 20 is inserted into the frame 10 in such a manner that the frame 21 makes engagement with the guide members 11 and slides thereon. With this arrangement, it becomes possible to insert and detach the disk drive unit 20 into and from the frame 10. The connectors 23 of the disk drive unit 20 engages with the back panel 40 in the state where the disk drive unit 20 is placed in position in the frame 10.

As shown in FIG. 3, a cover 12 is fastened to the front surface of the disk drive unit 20, which is covered by the cover 12.

Figure 7:
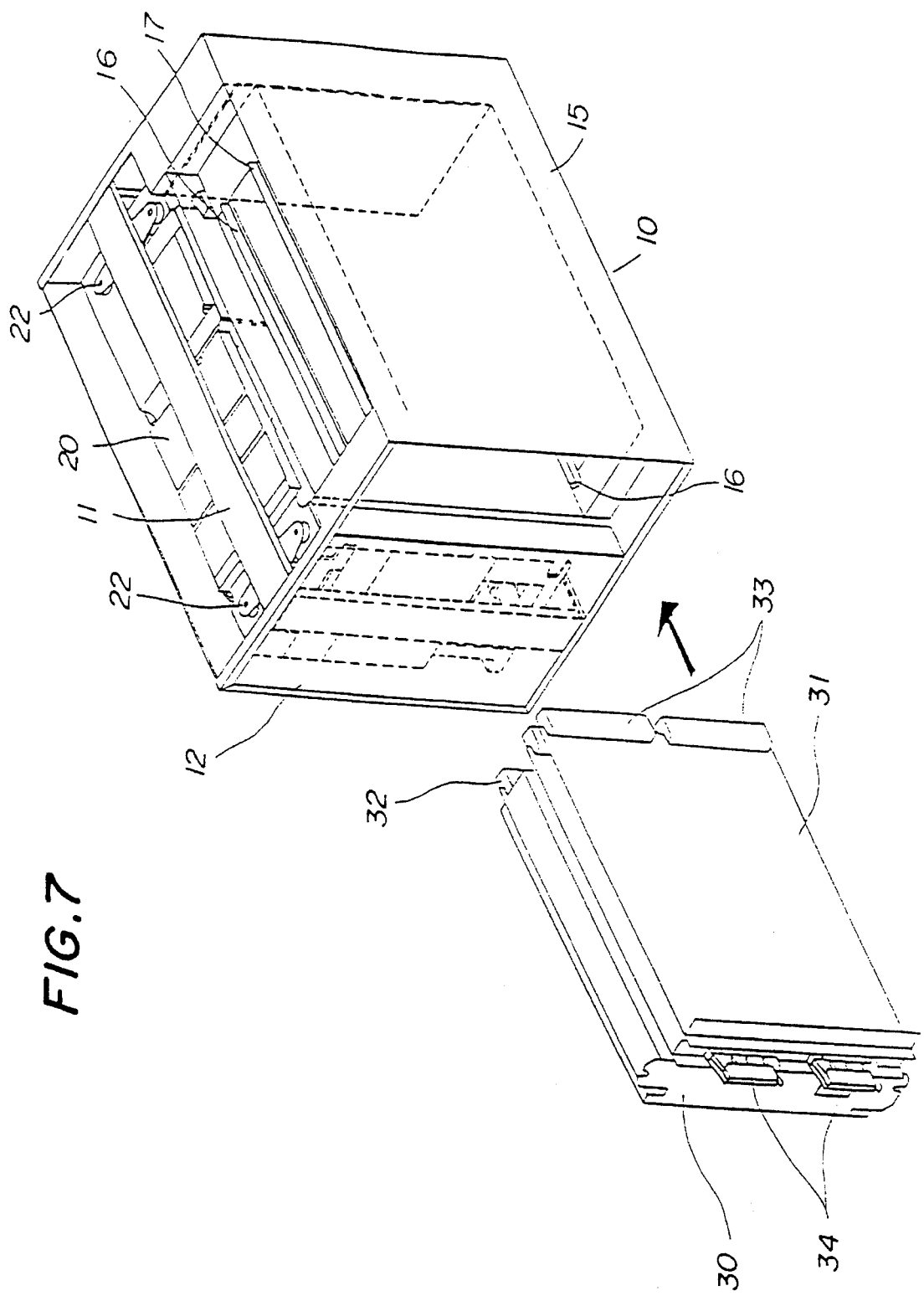
FIG. 7 is an exploded perspective view of the storage disk drive according to the first embodiment of the present invention.

As shown in FIG. 7, the power source 30 has power source connectors 32 at a back portion thereof. The circuit unit 31 is composed of two printed circuit boards. A servo control circuit and other circuits are mounted on the printed circuit boards. A front circuit unit connector 34 for external connection is provided at a front portion of each of the two printed circuit boards, and a back circuit unit connector 33 for external connection is provided at a back portion of each of the two printed circuit boards.

The power source 30 and the circuit unit 31 are inserted into the guide members 16 and 17 and pushed, so that they are accommodated in the frame 10. When the power source 30 and the circuit unit 31 are placed in position in the frame 10, the power source connectors 32 and back circuit unit connectors 33 engage with the back panel 40. With this engagement, the disk drive unit 20, the power source 30 and the circuit unit 31 are electrically connected to each other via the back panel 40. It is easy to draw the power source 30 and the circuit unit 31 from the front side of the frame 10.

Figure 8:
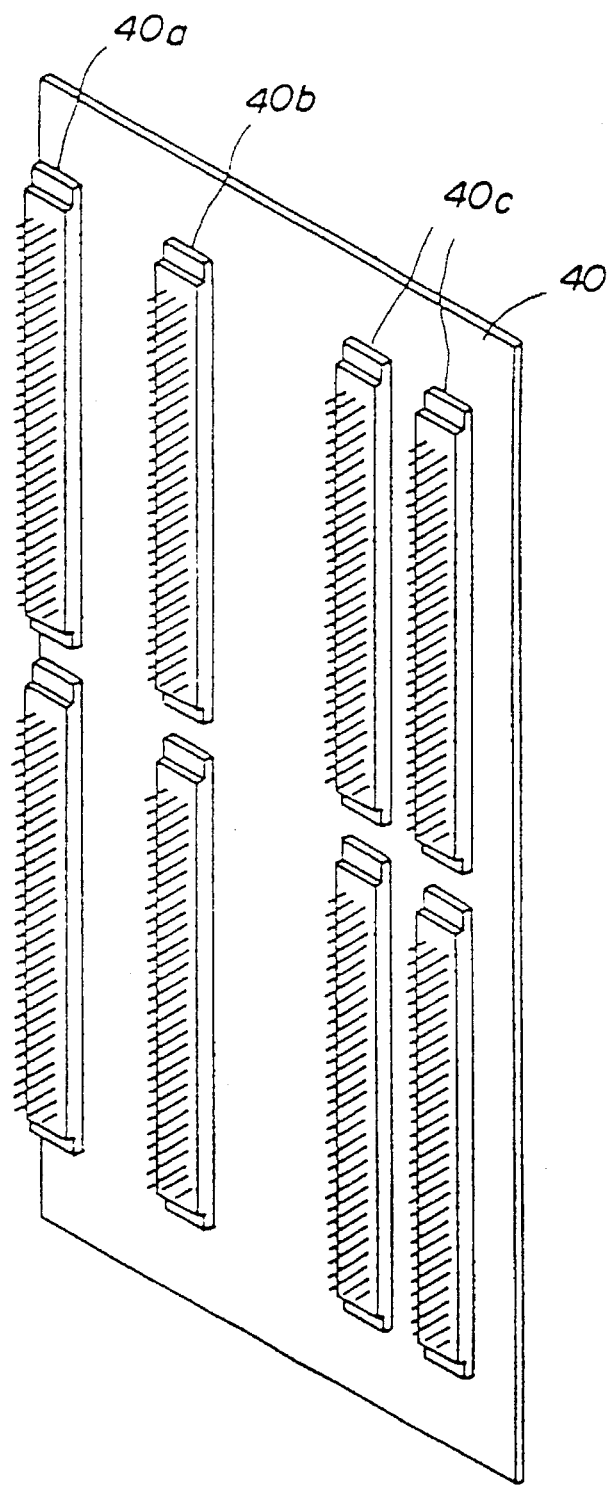
FIG. 8 is a perspective view of a back panel used in the first embodiment of the present invention.
Figure 9:
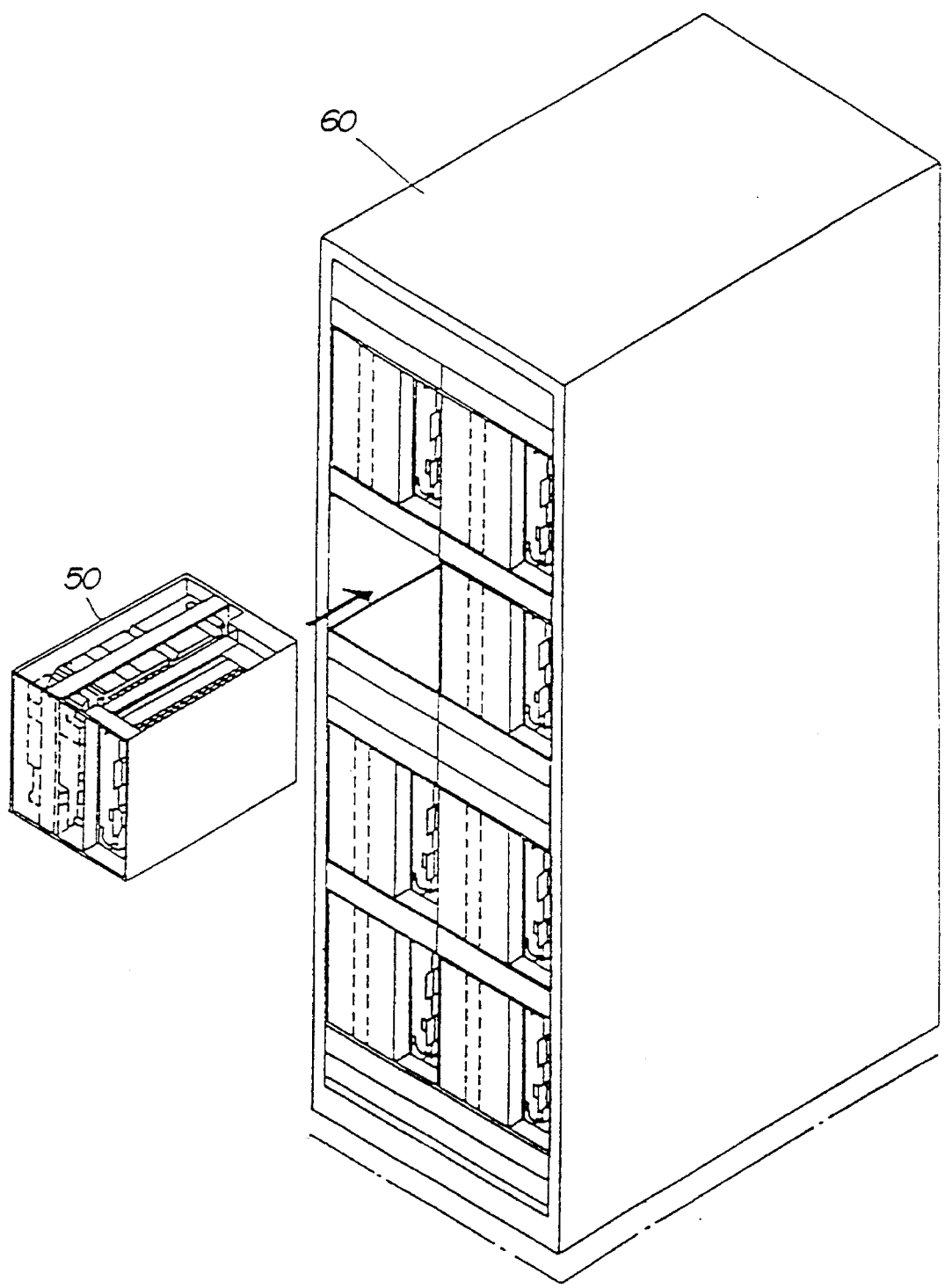
FIG. 9 is a perspective view of the storage disk device having a plurality of storage disk modules according to the first embodiment of the present invention.
Figure 10:
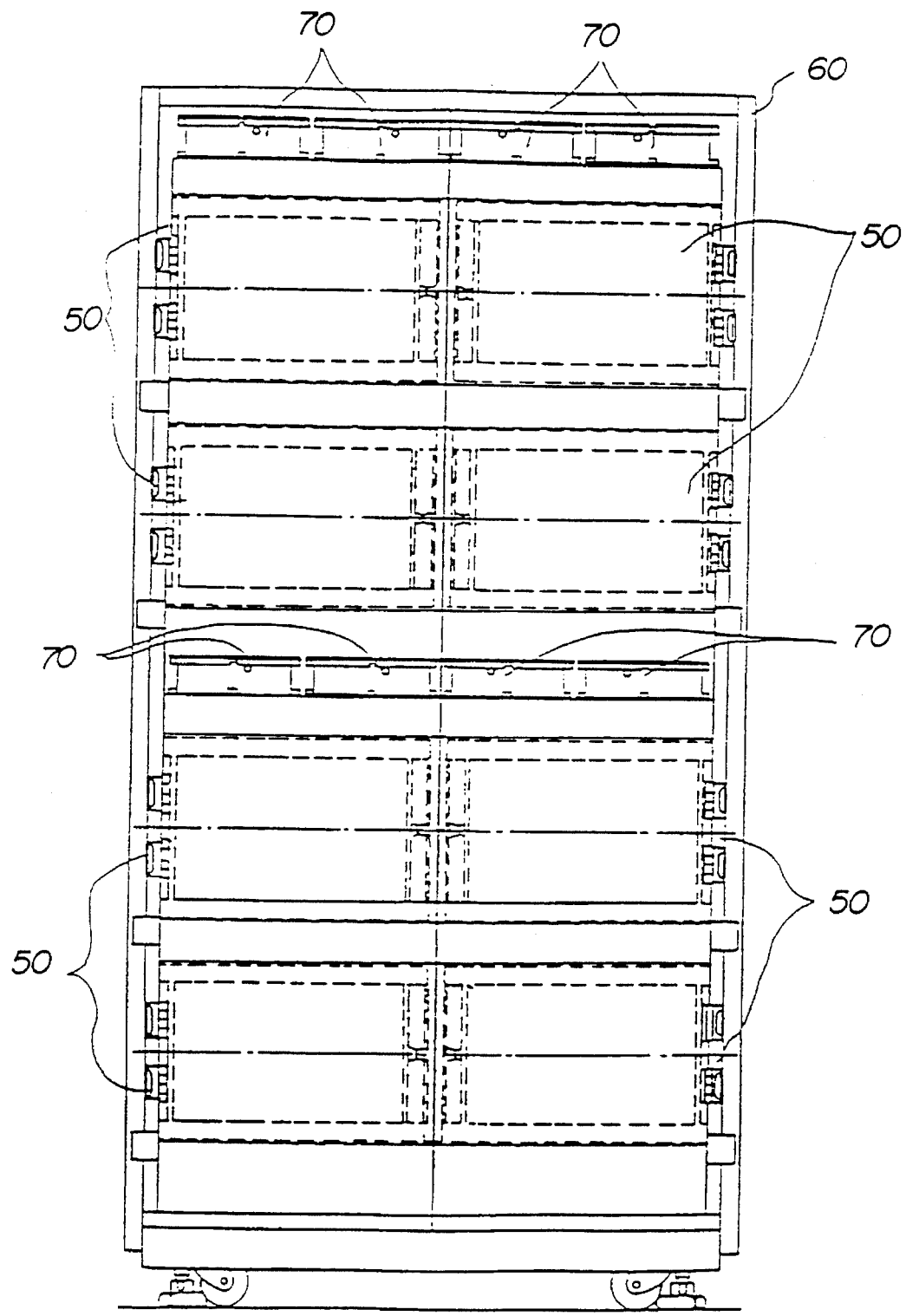
FIG. 10 is a side view of the storage disk device shown in FIG. 9.

As shown in FIG. 8 disk drive back panel connectors 40a for the disk drive unit 20, power source back panel connectors 40b for the power source 30, and circuit unit back panel connectors 40c for the circuit unit 31 are mounted on the back panel 40. Although not shown, printed circuits connected to the connectors 40a, 40b and 40c are formed on the back panel 40. As shown in FIG. 4, terminals of the connectors 40a, 40b and 40c project from the back surface of the back panel 40. With this arrangement, it becomes possible to check signals flowing in the printed circuits formed on the back panel 40 by utilizing the terminals projecting from the back surface thereof.

As shown in FIGS. 3 and 4, it is possible to separately draw the disk drive unit 20, the power source 30 and the circuit unit 31 from the front surface of the frame 10 and separately take them out the frame 10. It is possible to connect a power supply cable to the power source on the front side of the frame and to connect connection cables to the circuit unit 31 on the front side of the frame. It should be noted that the connection cables are not provided inside the storage disk module 50. That is, there is no need to provide a space for accommodating the connection cables. As a result, it becomes possible to diminish the size of the storage disk module 50 and increase the mounting density.

Figure 11:
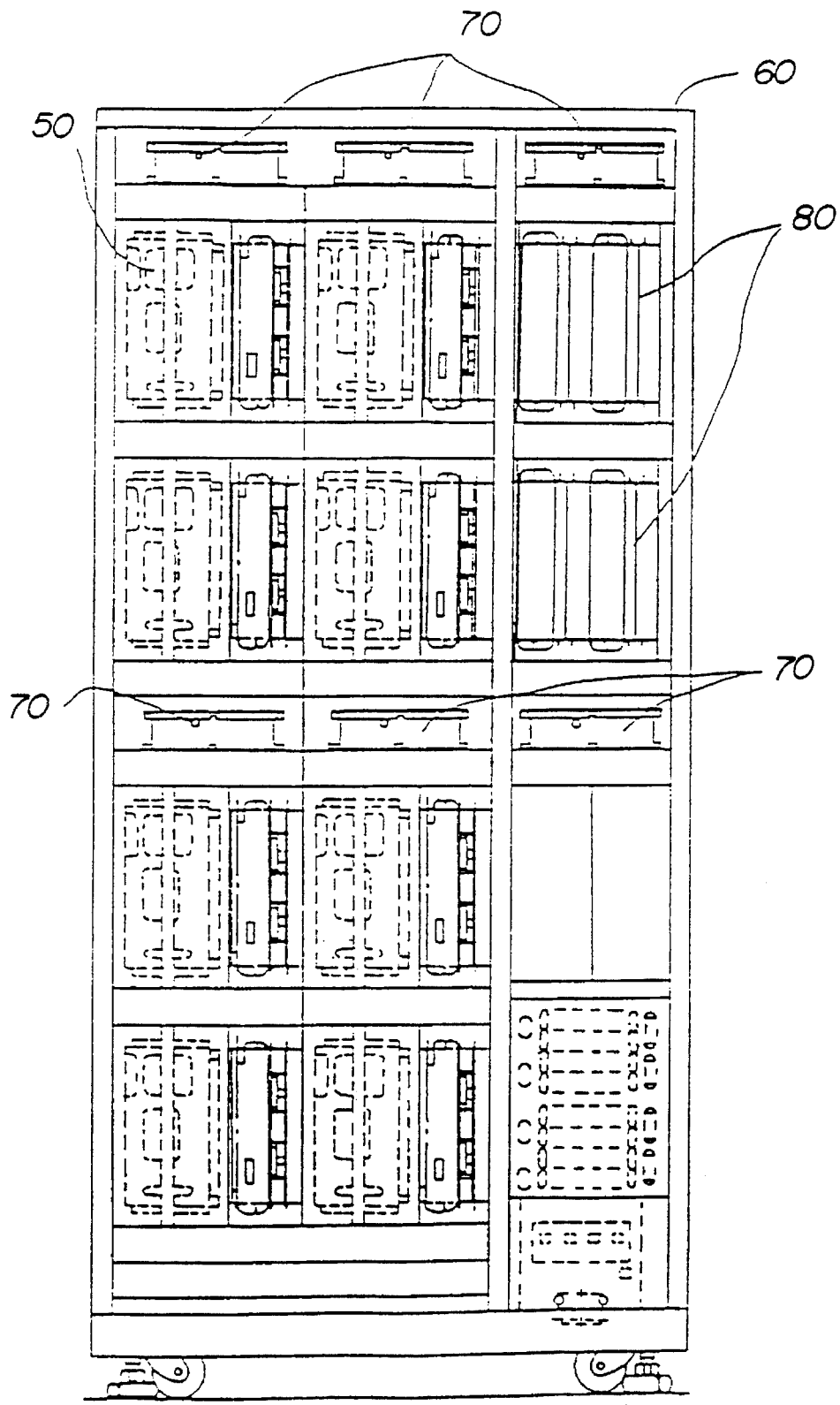
FIG. 11 is a front view of the storage disk device shown in FIG. 9.
Figure 12:
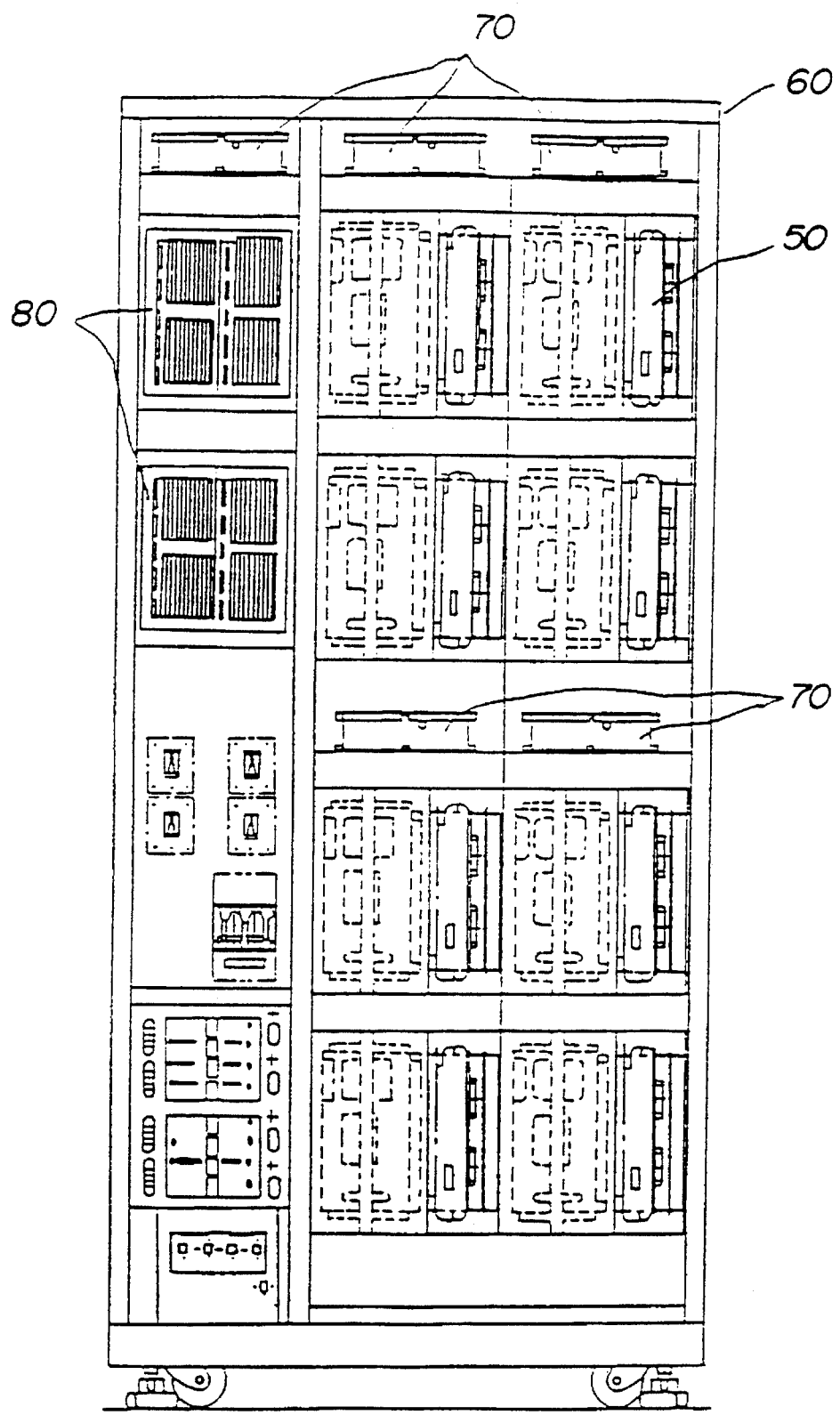
FIG. 12 is a rear view of the storage disk device shown in FIG. 9.

A description will now be given of a disk drive unit, which uses a plurality of storage disk modules, each having the above-mentioned structure. Referring to FIGS. 9 through 12, the disk drive unit has a locker 60, which has a plurality of floors on which a plurality of storage disk modules 50 are placed. A plurality of fans 70 are provided at upper and intermediate portions of the disk drive unit. There are two separate cooling systems, one of which cools the storage disk modules 50 arranged in a column, and the other of which cools the storage disk modules 50 arranged in another column. By the fans 70, air flows from the lower side of the locker 60 to the upper side thereof, and hence, the storage disk modules 50 are cooled. As shown in FIG. 11, string controllers 80, which communicate with a storage disk control apparatus (not shown), are accommodated in the locker 60.

As has been described previously, the storage disk modules 50 are not connected to other devices through the back surfaces thereof. Thus, it becomes possible to insert the storage disk modules 50 into the locker 60 from the front and back surfaces of the locker 60 in such a way that the back surfaces thereof are opposed to each other. The locker 60 shown in FIGS. 9 through 12 accommodates eight storage disk modules 50 inserted from the front side of the locker 60 and eight storage disk modules 50 inserted from the back side thereof. For simplicity, a door of the locker 60 and side plates thereof are omitted.

It is possible to replace each of the storage disk modules 50 with a new one and to replace the disk drive unit 20, the power source 30 or the circuit 31 of each of the storage disk modules 50 with a new one.

The storage disk modules 50 are connected to the string controllers 80 through front circuit unit the connectors 34 mounted on the front surface of the circuit unit 31 of each of the storage disk modules 50. The front circuit unit connectors 34 of the storage disk modules 50 are connected to each other by cables as if chains are formed by the cables.

If signals passing through the printed circuits on the back panel 40 of a desired one of the storage disk modules 50 are checked, this storage disk module 50 is detached from the locker 60 and placed on a board. In this state, cables are connected to the power source 30 and the circuit unit 31. The signals passing through the printed circuits on the back panel 40 can be output to the terminals projecting from the back surface of the back panel 40.

The storage disk modules may be magnetic storage disk modules or optical storage disk modules. It is possible to omit the rubber members 22 if a large magnitude of variation is not expected. It is possible to accommodate the storage disk modules 50 from one side of the locker 60.

A description will now be given of a second embodiment of the present invention. FIG. 13 shows an outline of the second embodiment of the present invention. A storage disk module 101 of the second embodiment of the present invention comprises a disk drive unit 102 for positioning heads with respect to storage disks, which are rotating by means of an access mechanism, a power source 103, a circuit unit 104 for controlling the operation of the disk drive unit 102, all of which are accommodated in a frame 110. The storage disk module 101 is accommodated in a locker 107.

In addition to the features of the first embodiment of the present invention, the second embodiment of the present invention has an essential feature in which connectors 106 are provided in a back surface of the back panel 105, which is used to electrically connect the disk drive unit 102, the power source 103 and the circuit unit 104 to each other. The connectors 106 engage with connectors 108 mounted on a projection member 170 fixed to a inner back surface of the locker 107. Cables 109 are connected to the connectors 108. If the connectors 106 engage with the connectors 108, the storage disk module 101 is electrically connected to a high-order device, such as a processor system.

Figure 14:
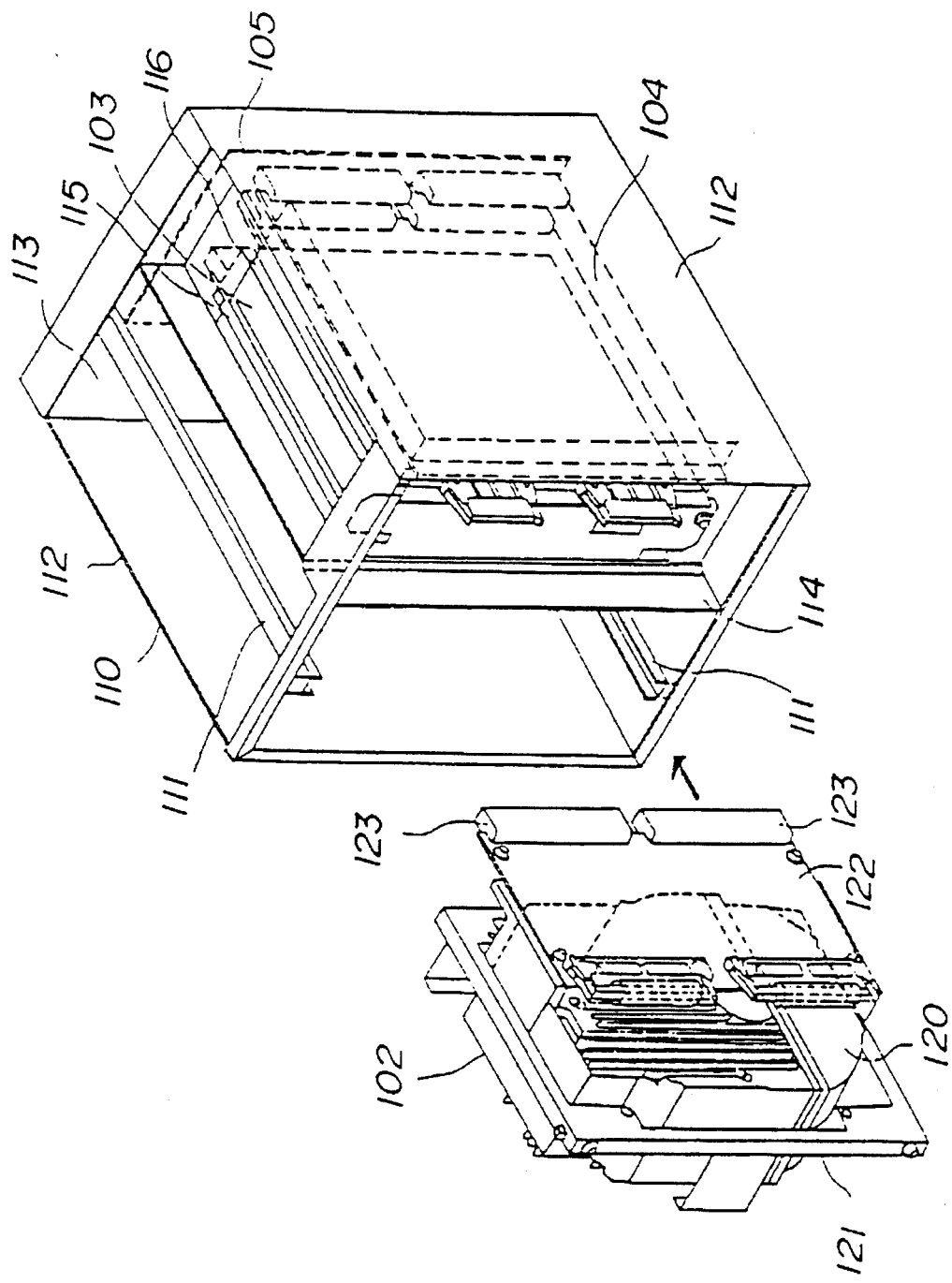
FIG. 14 is an exploded perspective view of a storage disk module according to the second embodiment of the present invention.

FIGS. 14 through 17B show the second embodiment of the present invention in more detail. As shown in FIG. 14, a front portion of the frame 110 is open, and a pair of side surfaces 112 are provided on opposite sides of the frame 110. A back surface of the frame 110 is covered by a back plate 113 and the back panel 105.

A partition plate 114 is provided in the frame 110 so that the inner area of the frame 110 is divided into a disk drive unit accommodating part and a circuit accommodating part. A pair of guide members (rails) 111 are provided in upper and lower portions of the disk drive unit accommodating part. A pair of guide members 115 for the power source 103 and a pair of guide members 116 for the circuit unit 104 are respectively provided in upper and lower portions of the circuit accommodating part. The upper and lower portions of the frame 110 are open except for the guide members 111, 115 and 116.

Figure 17B:
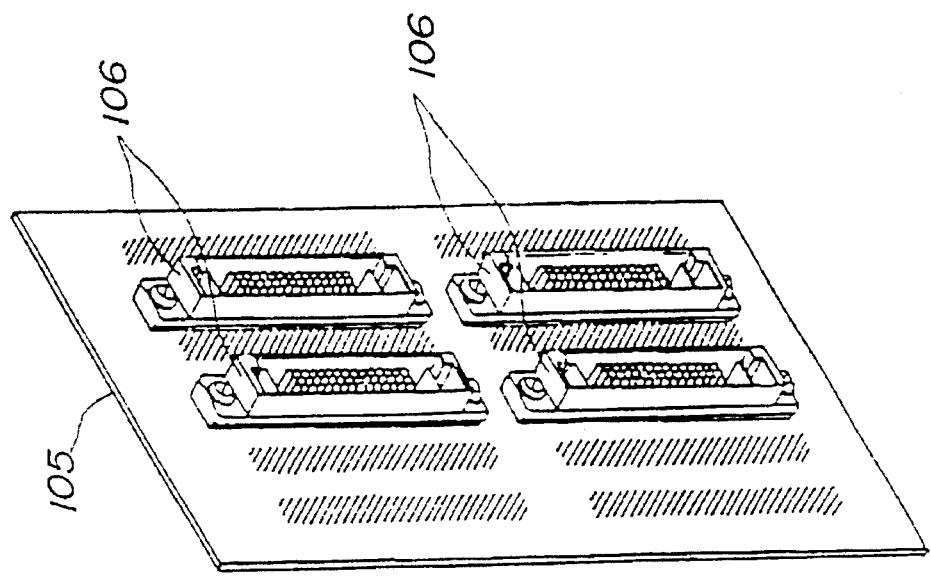
FIGS. 17A and 17B are perspective views of a back panel used in the second embodiment of the present invention.
Figure 17A:
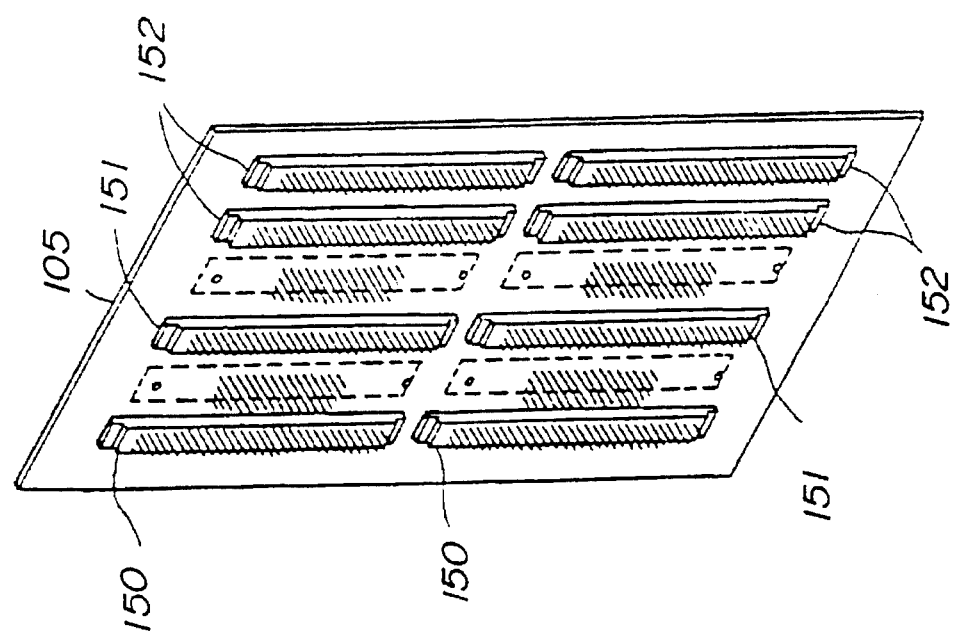

The back panel 105 is provided so that it is located at an inner position spaced apart from the back plate 113. As shown in FIG. 17A, connectors 150, 151 and 152 are mounted on the front surface of the back panel 105. The connectors 150 are connected to the disk drive unit 102, and the connectors 151 are connected to the power source 103. The connectors 152 are connected to the circuit unit 104. As shown in FIG. 17B, connectors 106 connected to the cables 109 (FIG. 13) are mounted to the back surface of the back panel 105.

Figure 15:
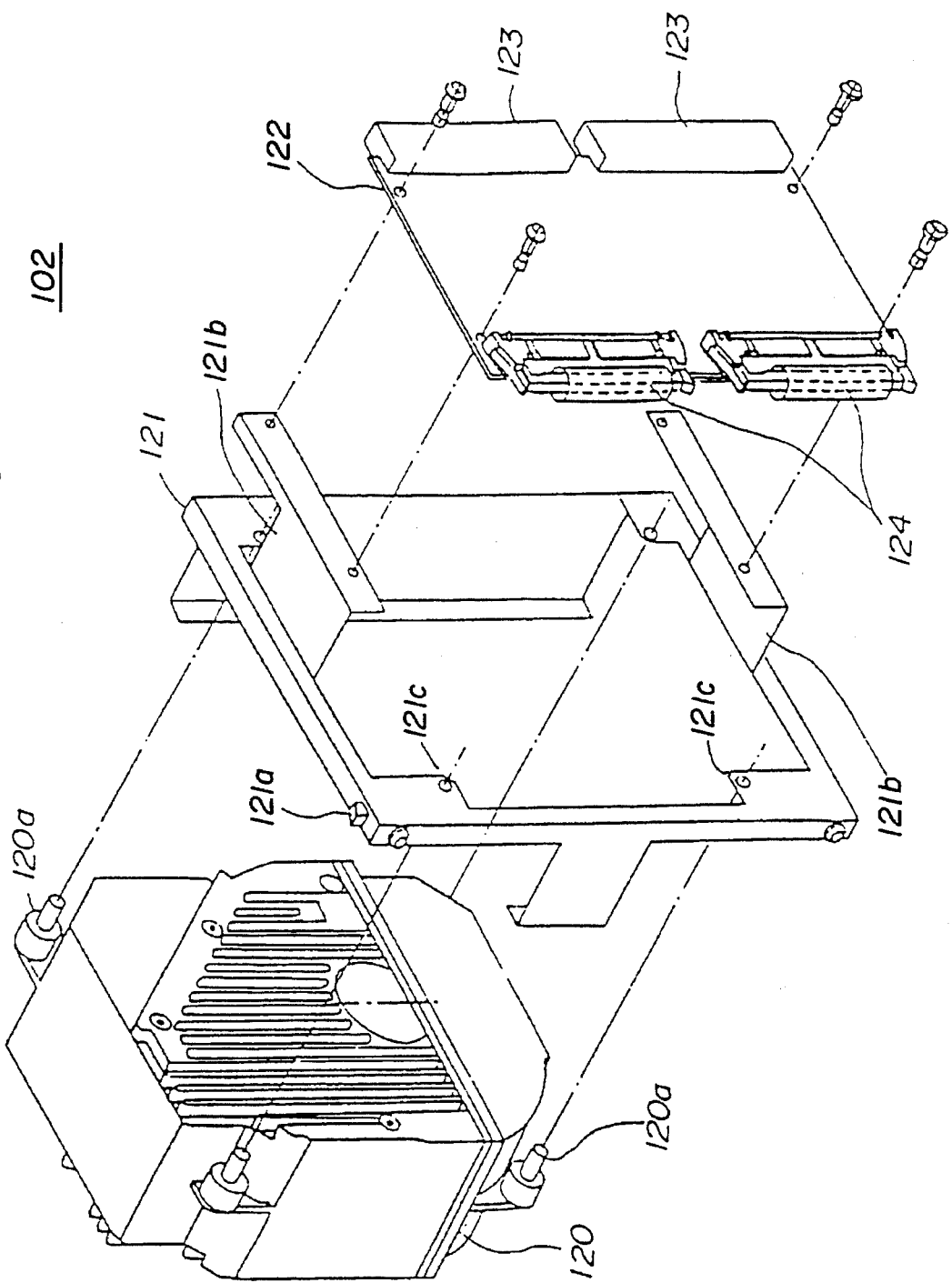
FIG. 15 is an exploded perspective view of a disk drive used in the second embodiment of the present invention.

As shown in FIG. 15, the disk drive unit 102 includes a frame 121, a drive main body 120 for positioning the heads by means of the access mechanism (not shown), and a printed circuit board 122. Projections 121a, which engage with the guide members 111, are provided on upper and lower portions of the frame 121. The frame 121 is fastened, by screws penetrating holes 121c formed therein, to the driver main body 120 using a buffer member made of, for example, rubber. The printed circuit board 122, on which an amplifier, an AGC circuit and so on are formed, is secured to attachment arms 121b of the frame 121 by screws.

Connectors 123 for connection with the connectors 150 of the back panel 105 and print cables 124 for connection with the drive main body 120 are attached to the printed circuit board 122. The sizes of the holes formed in the printed circuit board 122 are slightly greater than the diameters of the screws for securing the printed circuit board 122 to the attachment arms 121b. The printed circuit board 122 can slightly move within a limited range. Vibrations of the drive main body 120 are absorbed by the movable structure of the printed circuit board 122 and use of the cables 124, so that excessive force can be prevented from being exerted on the connectors 123.

Figure 16:
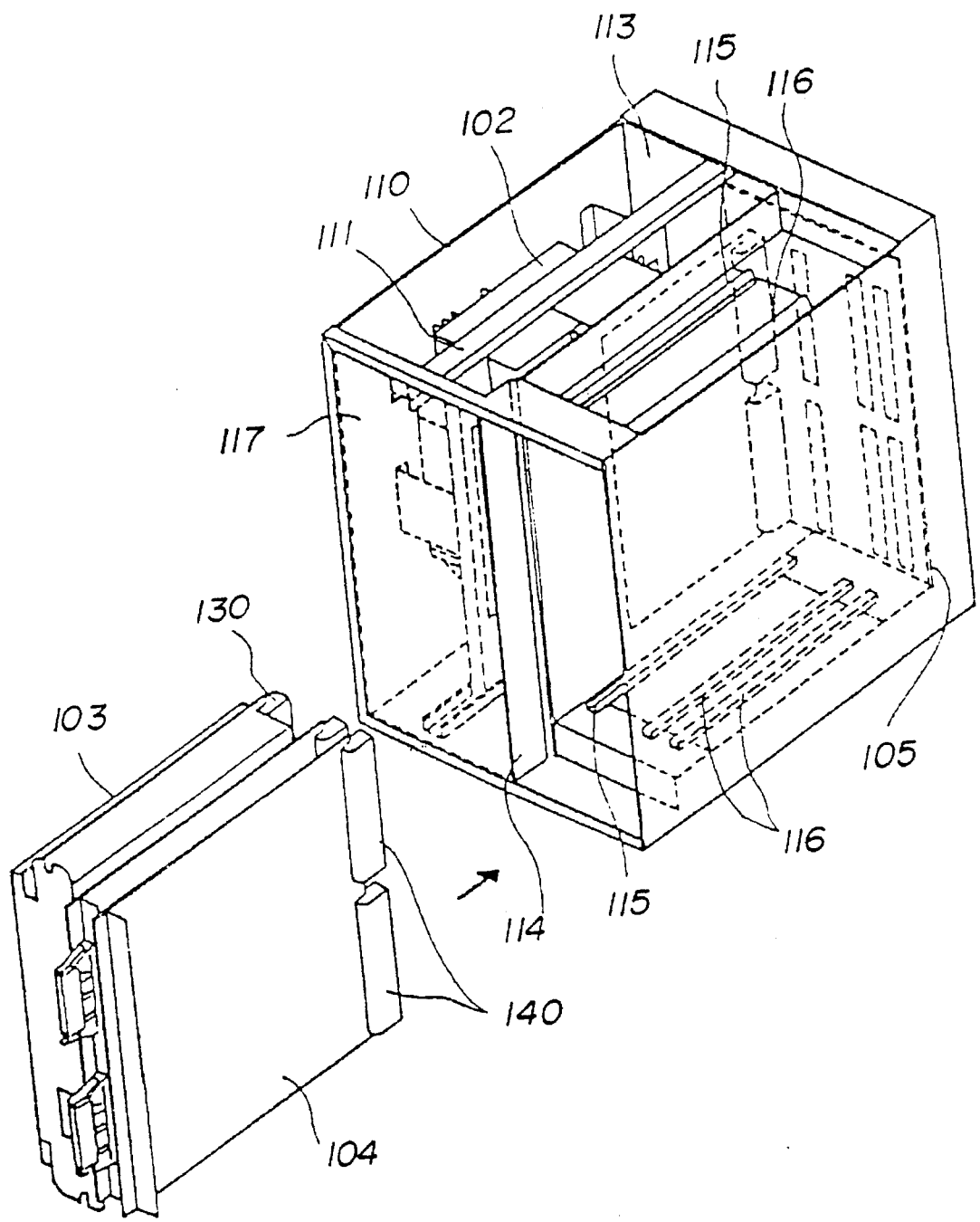
FIG. 16 is an exploded perspective view of the storage disk module of the storage disk module according to the second embodiment of the present invention.

As shown in FIG. 14, the storage disk drive 102 is inserted into the frame in such a manner that the frame 121 of the storage disk drive 102 engages with the guide members 111 and slides thereon. The connectors 123 are inserted into the connectors 150 of the back panel 105. By the projections 121b of the frame 121, the storage disk drive 102 is fastened to the guide members 111. Then, a front cover 117 is placed as shown in FIG. 16.

Connectors 130 are attached to an end portion of the power source 103, and connectors 140 are attached to an end portion of each of a pair of printed circuit boards of the circuit unit 104. The power source 103 and the circuit unit 104 are inserted into the guide members 115 and 116, respectively, and are slided thereon. The connectors 130 are inserted into the connectors 151 mounted on the back panel 105, and the connectors 140 are inserted into the connectors 152 mounted on the back panel 105.

The connectors 106 are mounted on the back surface of the back panel 105. With this arrangement, it becomes possible to connect the storage disk module to a high-order device through the back surface of the storage disk module 101. It is not necessary to provide cables in front of the storage disk module 101. Hence, it becomes easy to replace the storage disk module 101 with a new one or accommodate new storage disk modules in the locker 107.

The disk drive unit 102, the power source 103 and the circuit unit 104 are arranged side by side in a direction perpendicular to a direction in which the storage disk module 101 is inserted into the locker 107. Hence, it is easy to separately replace these elements with new ones on the front side of the storage disk module 101.

The disk drive unit 102 has the frame 121, which engages with and slides on the guide members 111 it is easy to replace the storage disk module accommodated in the locker 107 with a new one.

The printed circuit board 122 on which the connectors 123 are mounted is attached to the frame 121, so that the printed circuit board 122 can move within a limited range. Hence, excessive force arising from vibrations of the drive main body 120 is prevented from being exerted on the connectors 123.

Four sides of the frame 110 are closed (covered), and the upper and lower portions thereof are open. With this structure, a cooling air path having a duct structure can be formed. Hence, it is possible to effectively cool the inside of the storage disk module 101.

Figure 18:
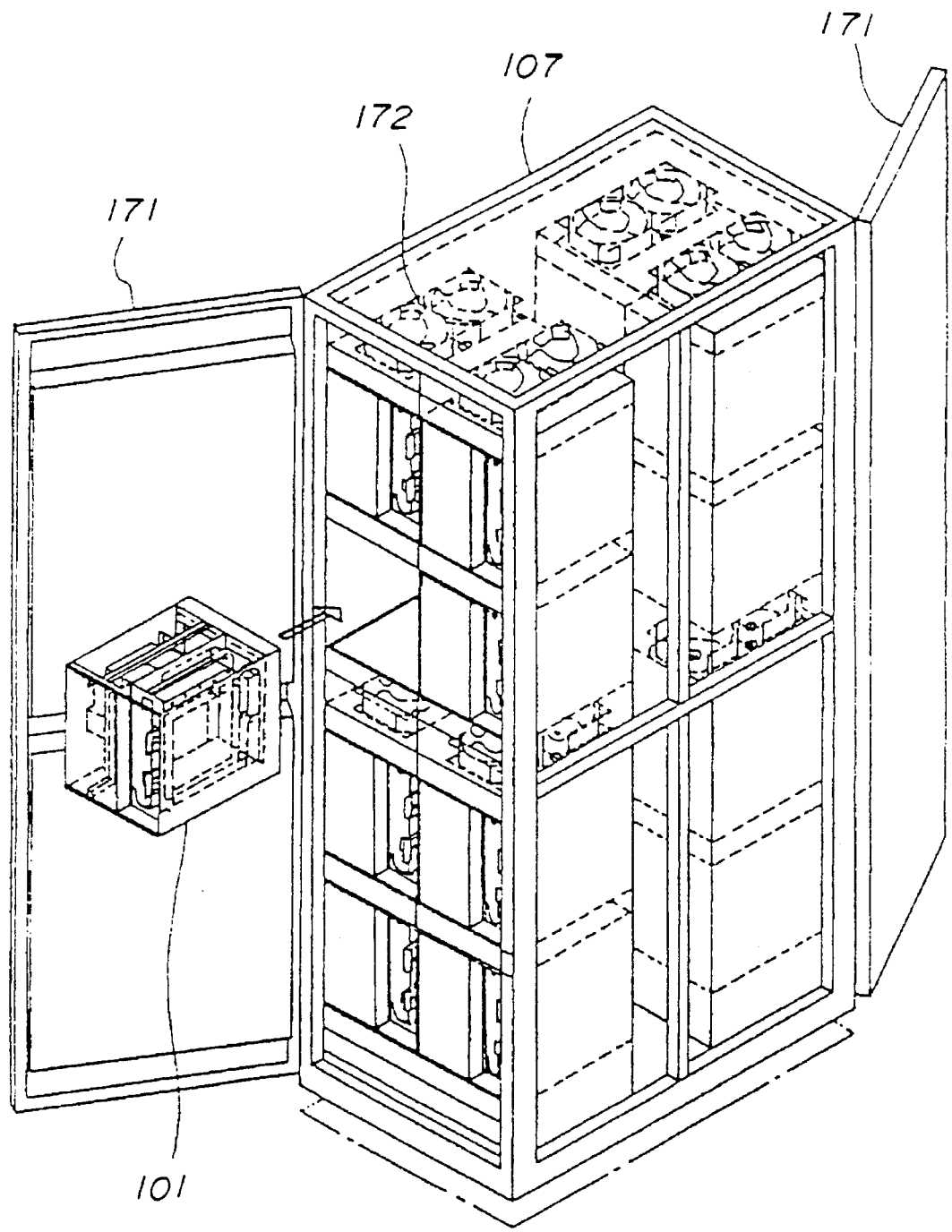
FIG. 18 is a perspective view of a storage disk device including a plurality of storage disk modules according to the second embodiment of the present invention.
Figure 19:
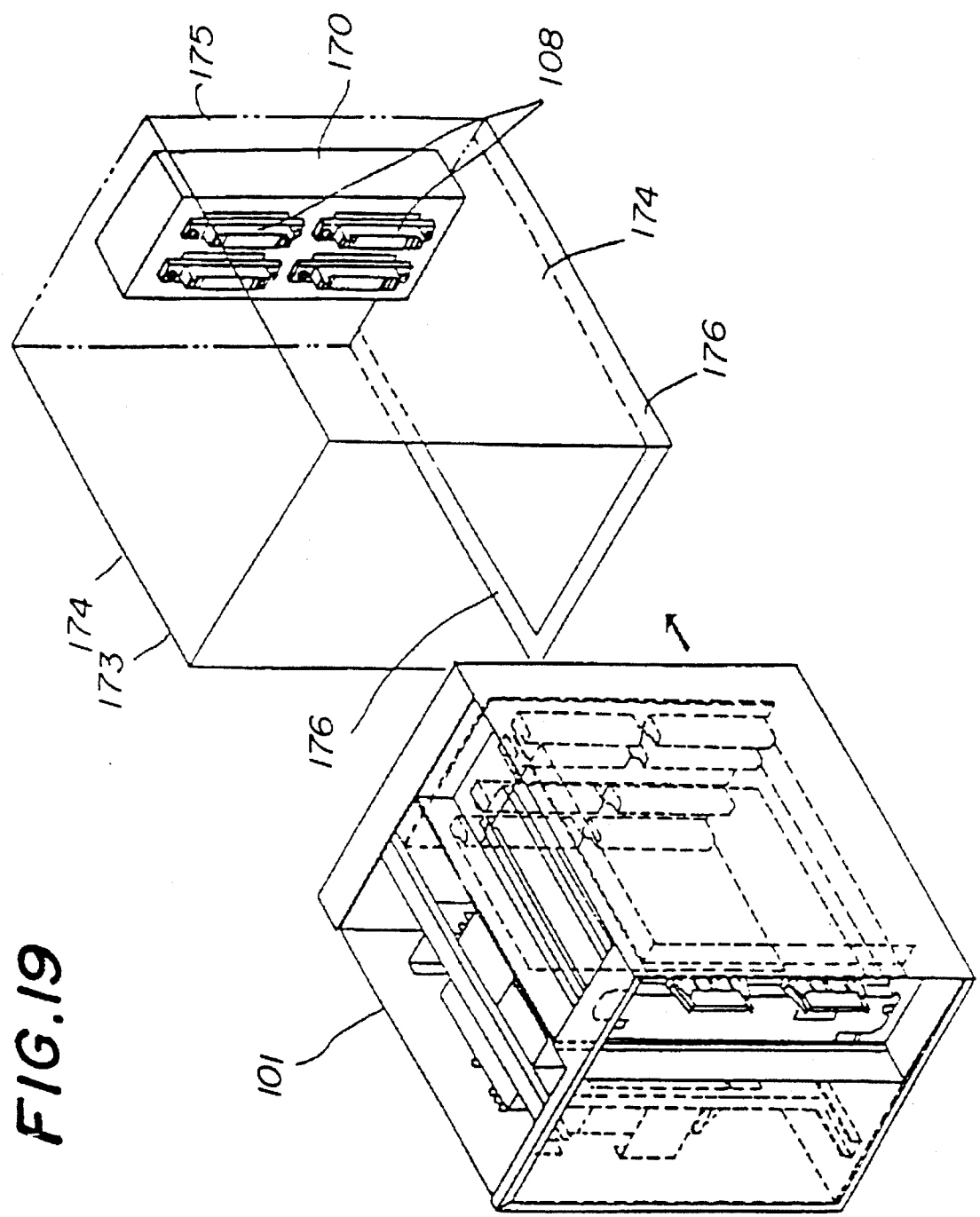
FIGS. 19 and 20 are exploded perspective views of the storage disk module shown in FIG. 18.
Figure 20:
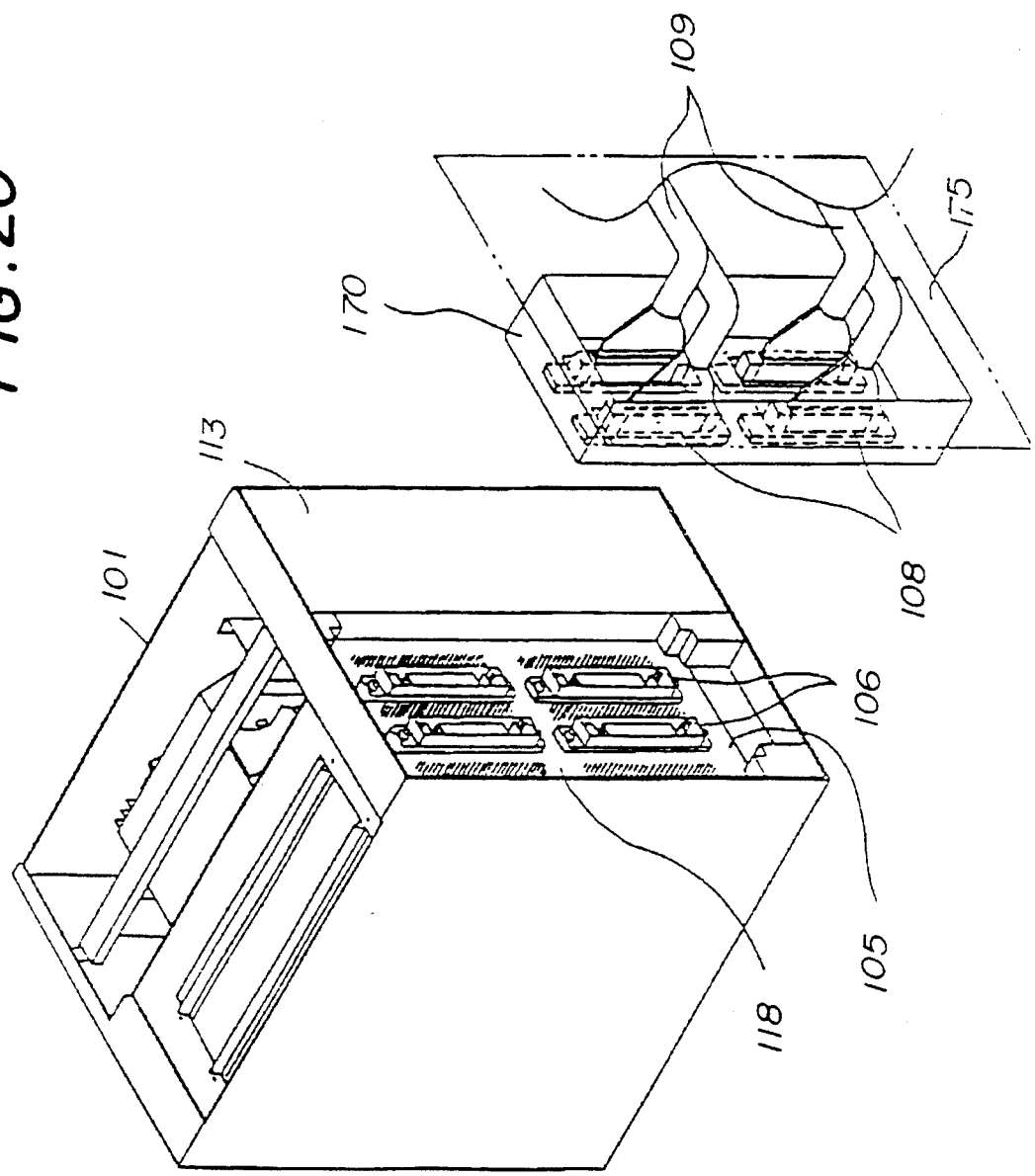

FIGS. 18 through 20 are diagrams of a storage disk device having a plurality of storage disk modules 101 of the second embodiment of the present invention. The storage disk device shown in FIGS. 18 through 20 is a slave type magnetic disk device, which is used in a state where it is connected to a master type magnetic disk device having a means (such as a string control circuit) for connecting the magnetic disk device to a high-order device. The slave type magnetic disk device is different from the master type magnetic disk device in only that the former does not have the above means.

The locker 107 has an upper space and a lower space, each of which has four module accommodating members 173, each having four storage disk modules 101. The back surfaces of the storage disk modules 101 adjacent to each other in the module inserting directions are opposed to each other. Two cooling fans 172 are provided for each of the four module accommodating members in each of the upper and lower spaces. As shown in FIGS. 19 and 20, the module accommodating member 173 has a front opening, side plates 174 and a back plate 175. Guide parts 176 are provided on both sides of a lower surface of the module accommodating member 173. An upper portion of the module accommodating member 173 is open. The projection member 170 is provided on the back plate 175 of the module accommodating member 173. Four connectors 108 corresponding to the connectors 106 are fastened to the projection 170 by screws. By forming holes in the connectors 108 so that they have sizes slightly greater than the diameters of the screws, the connectors 108 can move within a limited range.

As shown in FIG. 20, the cables 109 extend from the back portions of the connectors 108. The back panel 105 is located at an inner portion spaced apart from the back plate 113, so that a recess 118 is formed. This recess 118 has a shape complementary with the projection 170 of the module accommodating member 173. While the storage disk module 101 is being inserted into the module accommodating member 173, the projection 170 of the module accommodating member 173 is fitted into the recess 118 of the storage disk module 118 and automatically placed in position. Then, the connectors 106 of the storage disk module 101 makes engagement with the connectors 108, and is fixed thereto. In this manner, the connectors 106 are easily connected to the connectors 108 in plug-in operation. It is to be noted that even if the storage disk module is slightly obliquely inserted into the module accommodating member 173, it becomes possible for the connectors 106 to definitely engage with the connectors 108 because the connectors 108 can move within the limited range. It is also possible to easily draw the storage disk module 101 from the module accommodating member 173.

In the above-mentioned manner, it becomes possible to easily connect the storage disk module 101 to the high-order device by the plug-in operation.

The upper and lower portions of the module accommodating members 173 are open. Hence, the duct structure vertically extending is formed and a high cooling efficiency can be obtained. Two doors 171 are provided on the front and back surfaces of the locker 107. By closing the doors 171, the front openings of the storage disk modules 101 can be covered. With this structure, the duct structure can be maintained even if the module accommodating members 173 do not have the storage disk modules 101.

Variations of the second embodiment of the present invention may be made. For example, it is possible to directly connect the cables 109 to the connectors 106 of the storage disk module 101.

Figure 21:
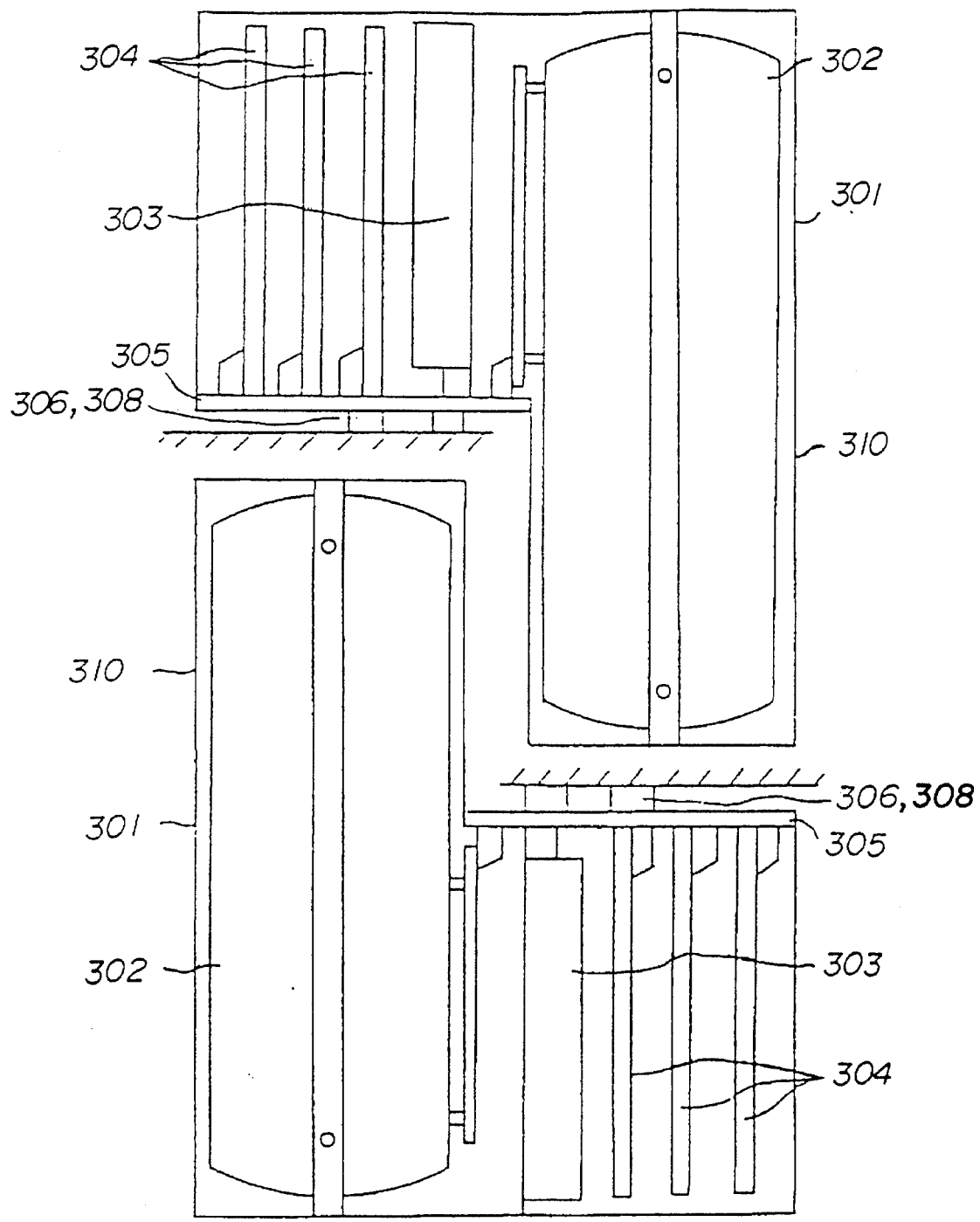
FIG. 21 is a plan view showing an outline of a storage disk module according to a third embodiment of the present invention.

A description will now be given of a third embodiment of the present invention. FIG. 21 shows an outline of the third embodiment of the present invention. In FIG. 21, there are illustrated two storage disk modules 301, each having an identical structure. Each of the storage disk modules 301 includes a disk drive unit 302, a power source 303 and a circuit unit 304, all of which are accommodated in a frame 310.

Each of the storage disk modules 301 has a long area having a first depth (length from a front surface thereof) and a short area having a second depth shorter than the first depth. The disk drive unit 301 is accommodated in the long area, and the power source 303 and the circuit unit 304 are accommodated in the short area. The two storage disk modules 301 are arranged so that the back surfaces of the two storage disk modules 301 are opposed to each other. More specifically, the long area of one of the two storage disk modules 301 is opposed to the short area of the other storage module 301. With this arrangement, it becomes possible to diminish the storage disk modules 301.

A back panel 305 is fastened to the back portion of the short area of each of the storage disk modules 301. Connectors 306 and 308 are mounted on a back surface of the back panel 305.

Figure 22:
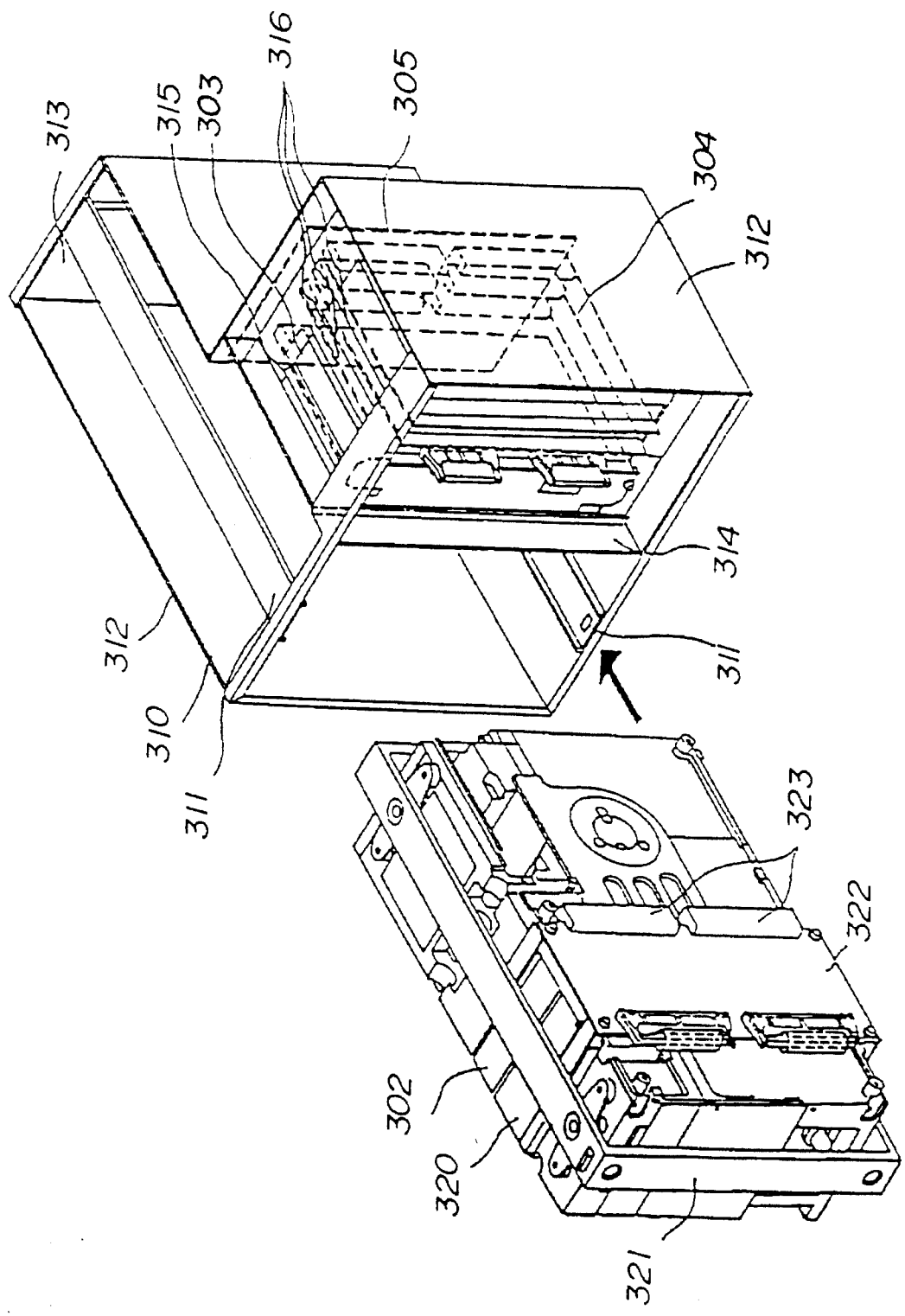
FIG. 22 is an exploded perspective view of the storage disk module according to the third embodiment of the present invention.

FIGS. 22 through 26 show the third embodiment of the present invention in more detail. As shown in FIG. 22, the frame 310 has an L-shaped structure, and has a front opening, side plates 312 and a back surface covered by a back plate 313 and the back panel 305.

A partition plate 314 is provided in the frame 310 so that the inner area of the frame 110 is divided into a disk drive unit accommodating part and a circuit accommodating part. The disk drive unit accommodating part is longer than the circuit accommodating part. A pair of guide members (rails) 311 are provided in upper and lower portions of the disk drive unit accommodating part, a pair of guide members 315 for the power source 303 and three guide members 316 for the circuit unit 304 are provided in upper and lower portions of the circuit accommodating part. The upper and lower portions of the frame 310 are open except for the guide members 311, 315 and 316.

Figure 25B:
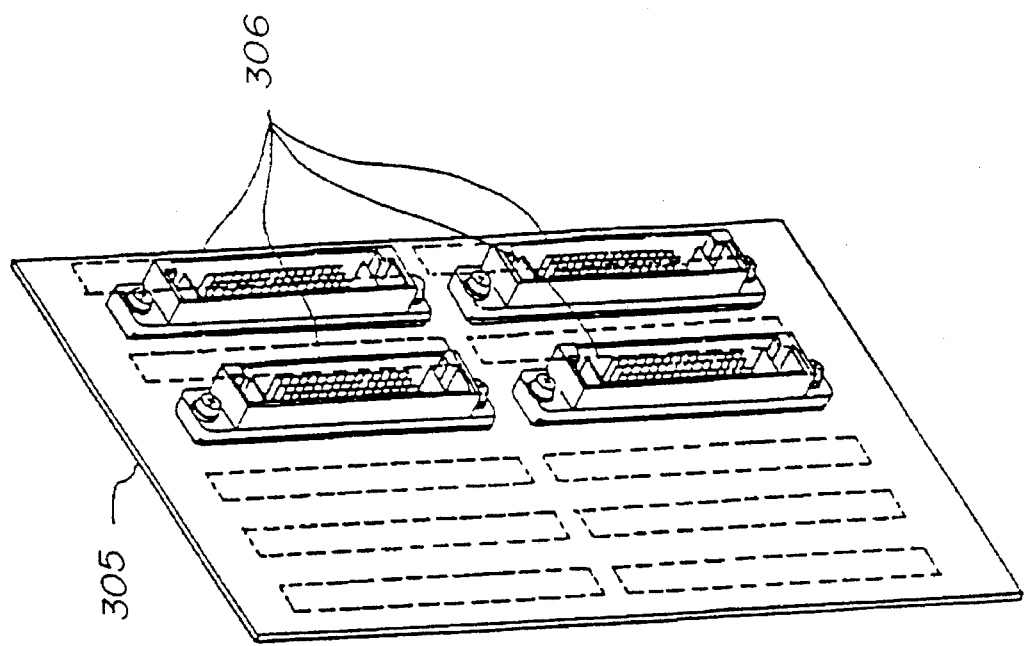
FIGS. 25A and 25B are perspective views of a back panel used in the third embodiment of the present invention.
Figure 25A:
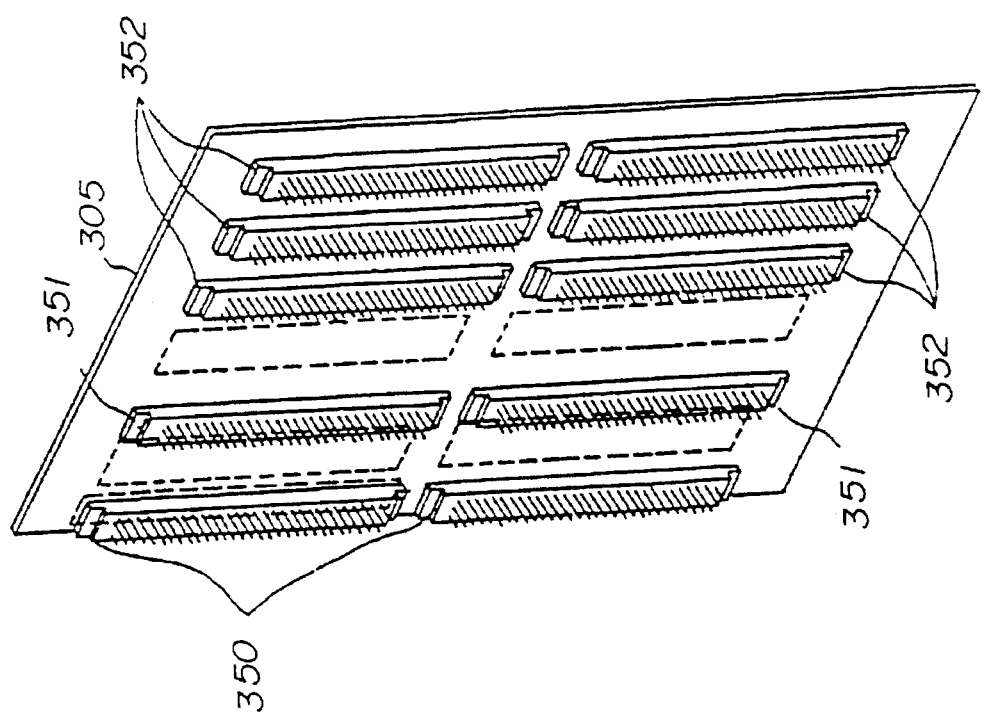

The back panel 305 is provided so that it is located at an inner position spaced apart from the back plate 313. As shown in FIG. 25A, connectors 350, 351 and 352 are mounted on the front surface of the back panel 305. The connectors 350 are connected to the disk drive unit 302, and the connectors 351 are connected to the power source 303. The connectors 352 are connected to the circuit unit 304. As shown in FIG. 25B, four connectors 306 are mounted to the back surface of the back panel 305.

Figure 23:
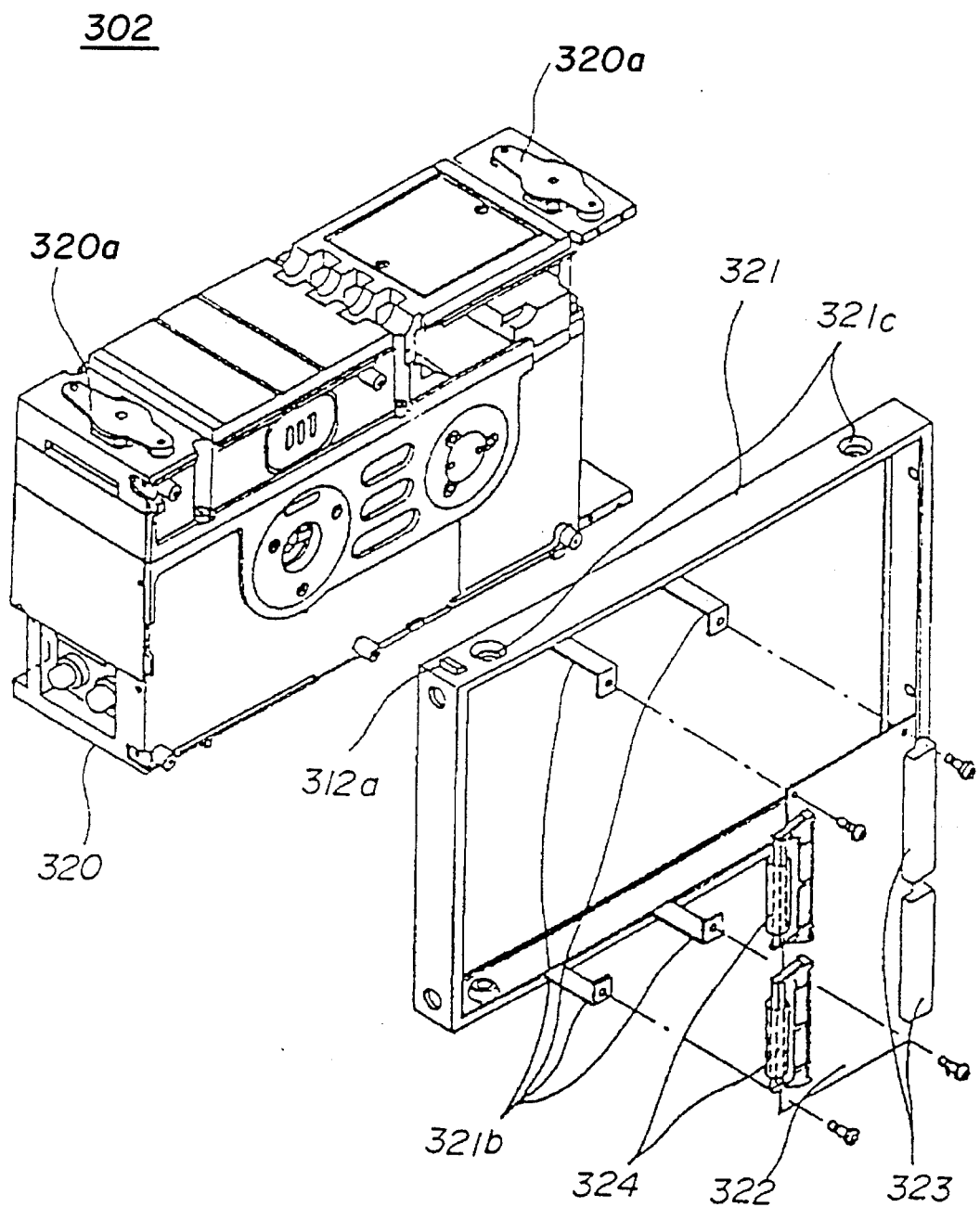
FIG. 23 is an exploded perspective view of a disk drive unit used in the third embodiment of the present invention.

As shown in FIG. 23, the disk drive unit 302 includes a frame 321, a drive main body 320 for positioning the heads by means of the access mechanism (not shown), and a printed circuit board 322. Projections 321a, which engage with the guide members 311, are provided on upper and lower portions of the frame 321. The frame 321 is fastened, by screws penetrating holes 321c formed therein, to the drive main body 320 using buffer members 320a made of, for example, rubber. The printed circuit board 322, on which an amplifier, an AGC circuit and so on are formed, is secured to attachment arms 321b of the frame 321 by screws.

Connectors 323 for connection with the connectors 350 of the back panel 305 and print cables 324 for connection with the drive main body 320 are attached to the printed circuit board 322. The sizes of the holes formed in the printed circuit board 322 are slightly greater than the diameters of the screws for securing the printed circuit board 322 to the attachment arms 321b. The printed circuit board 322 can slightly move within a limited range. Vibrations of the drive main body 320 are absorbed by the movable structure of the printed circuit board 322 and use of the cables 324, so that excessive force can be prevented from being exerted on the connectors 323.

Figure 24:
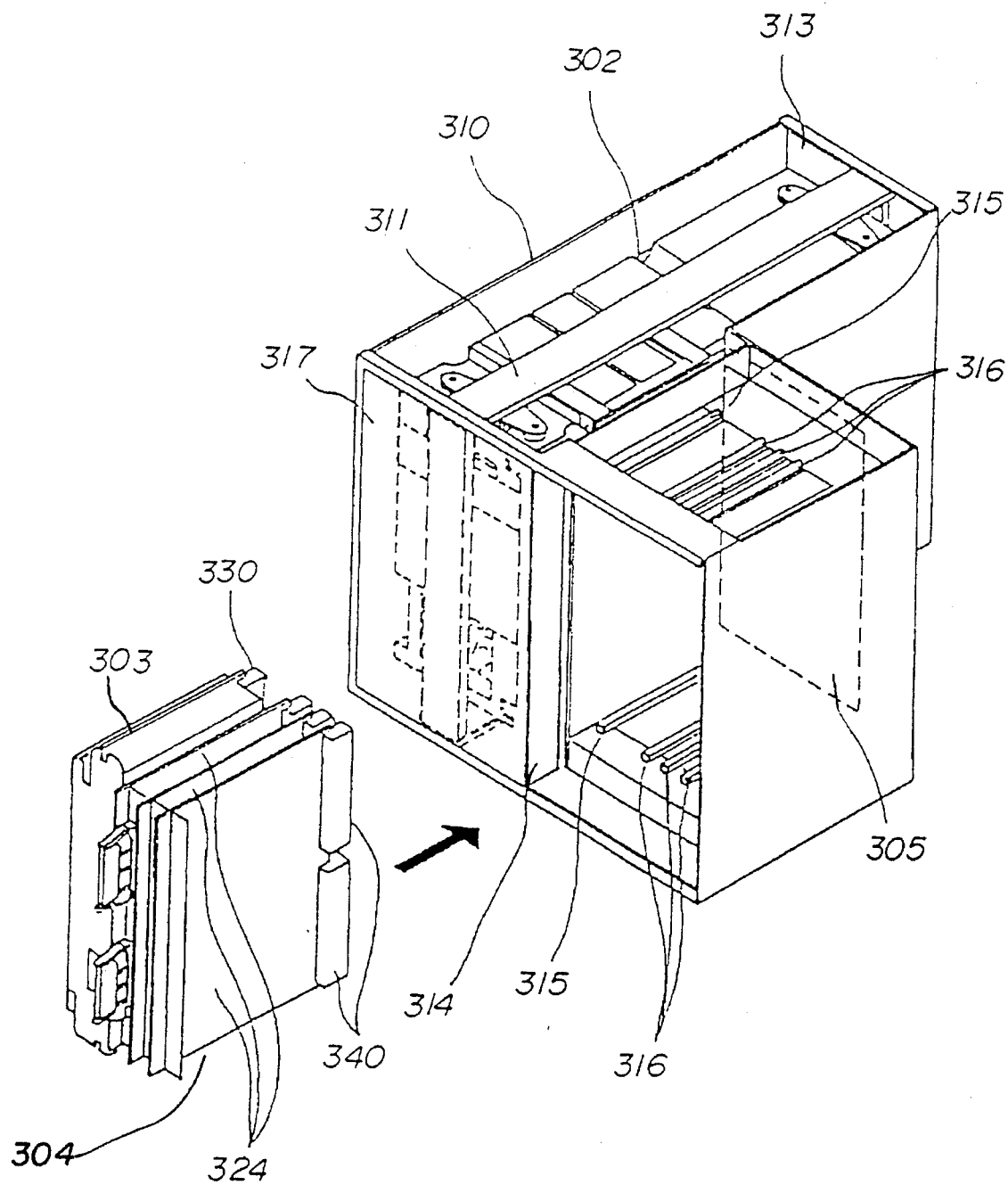
FIG. 24 is an exploded perspective view of the storage disk module according to the third embodiment of the present invention.

As shown in FIG. 22, the storage disk drive 302 is inserted into the frame 310 in such a manner that the frame 321 of the storage disk drive 302 engages with the guide members 311 and slides thereon. The connectors 323 are inserted into the connectors 350 of the back panel 305. By the projections 321b of the frame 321, the storage disk drive 302 is fastened to the guide members 311. Then, a front cover 317 is placed as shown in FIG. 24.

Connectors 330 are attached to an end portion of the power source 303, and connectors 340 are attached to an end portion of each of three printed circuit boards of the circuit unit 304. The power source 303 and the circuit unit 304 are inserted into the guide members 315 and 316, respectively, and are slided thereon. The connectors 330 are inserted into the connectors 351 mounted on the back panel 305, and the connectors 340 are inserted into the connectors 352 mounted on the back panel 305.

The third embodiment of the present invention has a particular advantage in addition to the advantages of the first and second embodiments of the present invention. The disk drive unit accommodating part is long and the circuit accommodating part is short. Thus, if the two storage disk modules 301 are arranged as shown in FIG. 21, the disk drive unit accommodating part of one of the two modules is opposed to the circuit accommodating part of the other module. Hence, the entire depth can be reduced. The disk drive unit accommodating part has a limited length (depth) based on the disk drive unit 302. However, it is possible to arbitrary select the length (depth) of the circuit accommodating part because the power source 303 and the circuit unit 304 do not have limited dimensions. In order to shorten the depth of the circuit accommodating part, an increased number of printed circuit board are arranged side by side in the circuit accommodating part.

Figure 27:
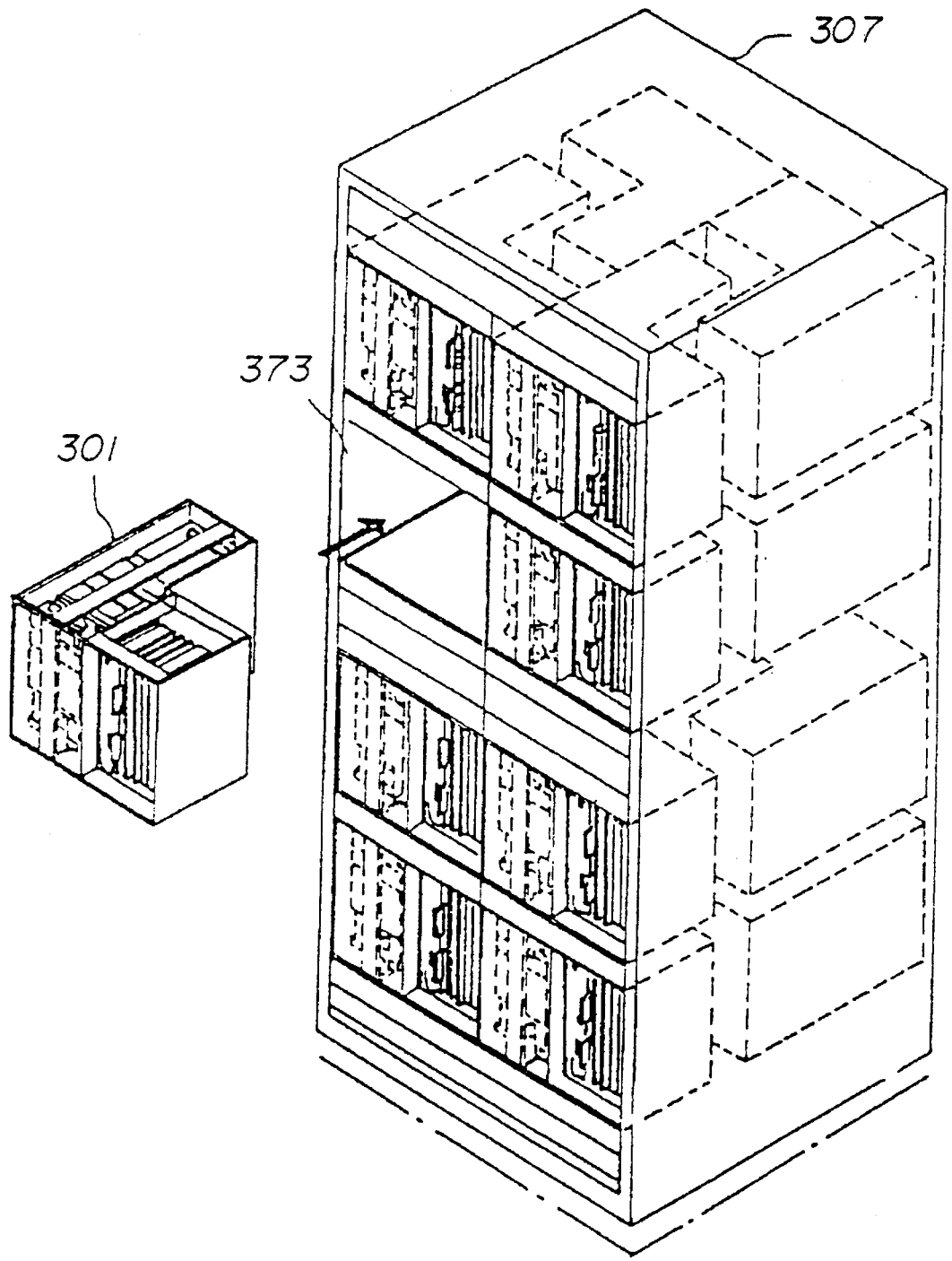
FIG. 27 is a perspective view of a storage disk device including a plurality of storage disk modules according to the third embodiment of the present invention.
Figure 28:
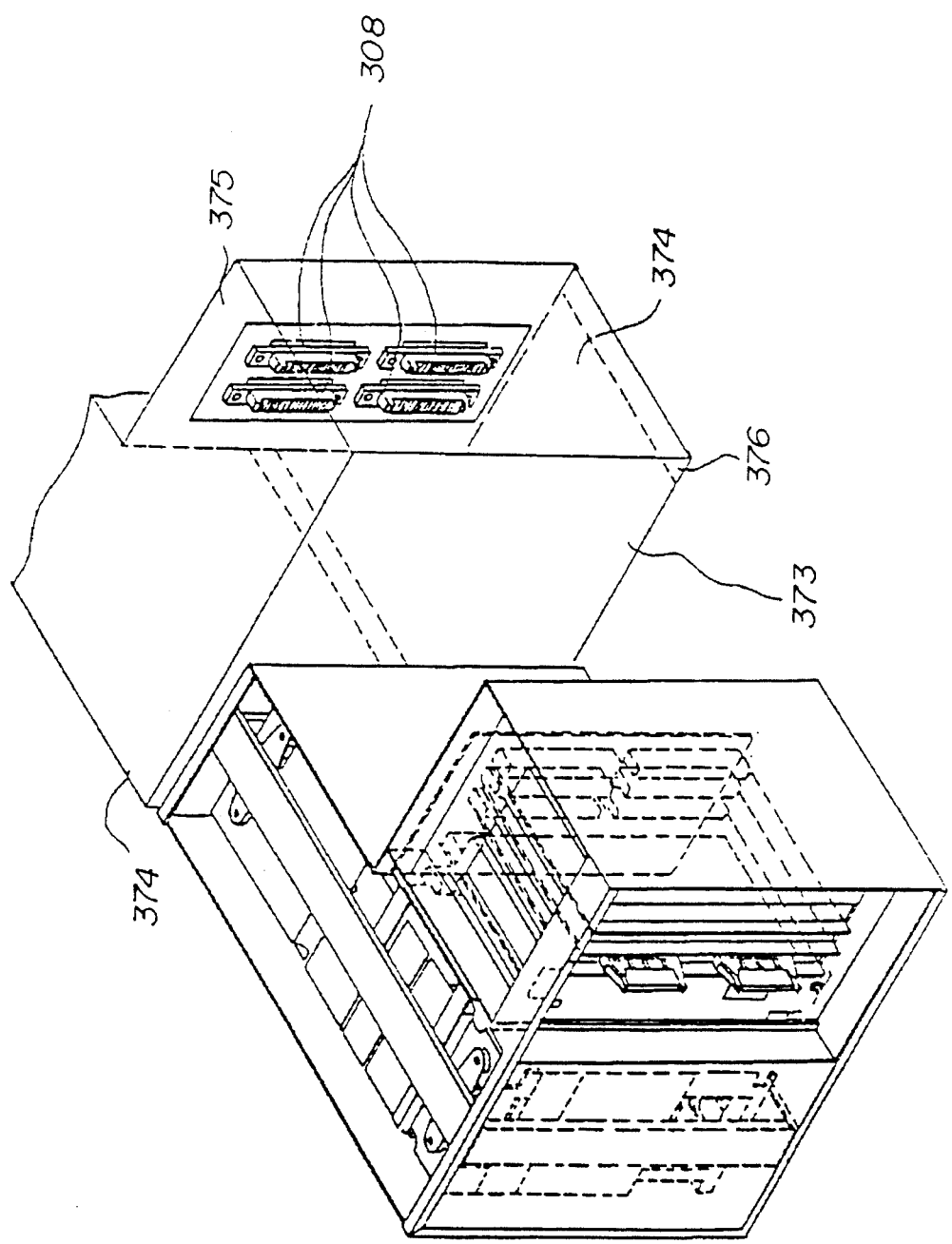
FIG. 28 is a perspective view of the storage disk module used in the storage disk device.

FIGS. 27 and 28 are diagrams of a storage disk device having a plurality of storage disk modules 301 of the third embodiment of the present invention. The storage disk device shown in FIGS. 27 and 28 is a slave type magnetic disk device.

The locker 307 has 16 module accommodating members 373 arranged in four columns. Each of the columns is composed of four module accommodating members 373. One of paired storage disk modules 301 is inserted into the locker 307 through the front surface thereof, and the other storage module 301 is inserted into the locker 307 through the back surface thereof in such a manner that the back surfaces of the paired modules 301 are opposed to each other. Two cooling fans and two doors (not shown for simplicity) are provided in the same manner as shown in FIG. 18. As shown in FIG. 28, the module accommodating member 373 has an L-shaped plan view. The module accommodating member 373 has a front opening, side plates 374 and a back plate 375. Guide parts 376 are provided on both sides of a lower surface of the module accommodating member 373. An upper portion of the module accommodating member 373 is open. Four connectors 308 corresponding to the connectors 306 are fastened to the back plate 375 by screws. By forming holes in the connectors 308 so that they have sizes slightly greater than the diameters of the screws, the connectors 308 can move within a limited range. Cables (not shown for simplicity) for connection with the string control circuits are connected to the back portions of the connectors 308.

In a variation of the third embodiment of the present invention, the disk drive unit accommodating part has a depth shorter than that of the circuit accommodating part. It is also possible to directly connect the cables (not shown) to the connectors 306 of the storage disk module 301.

Figure 29:
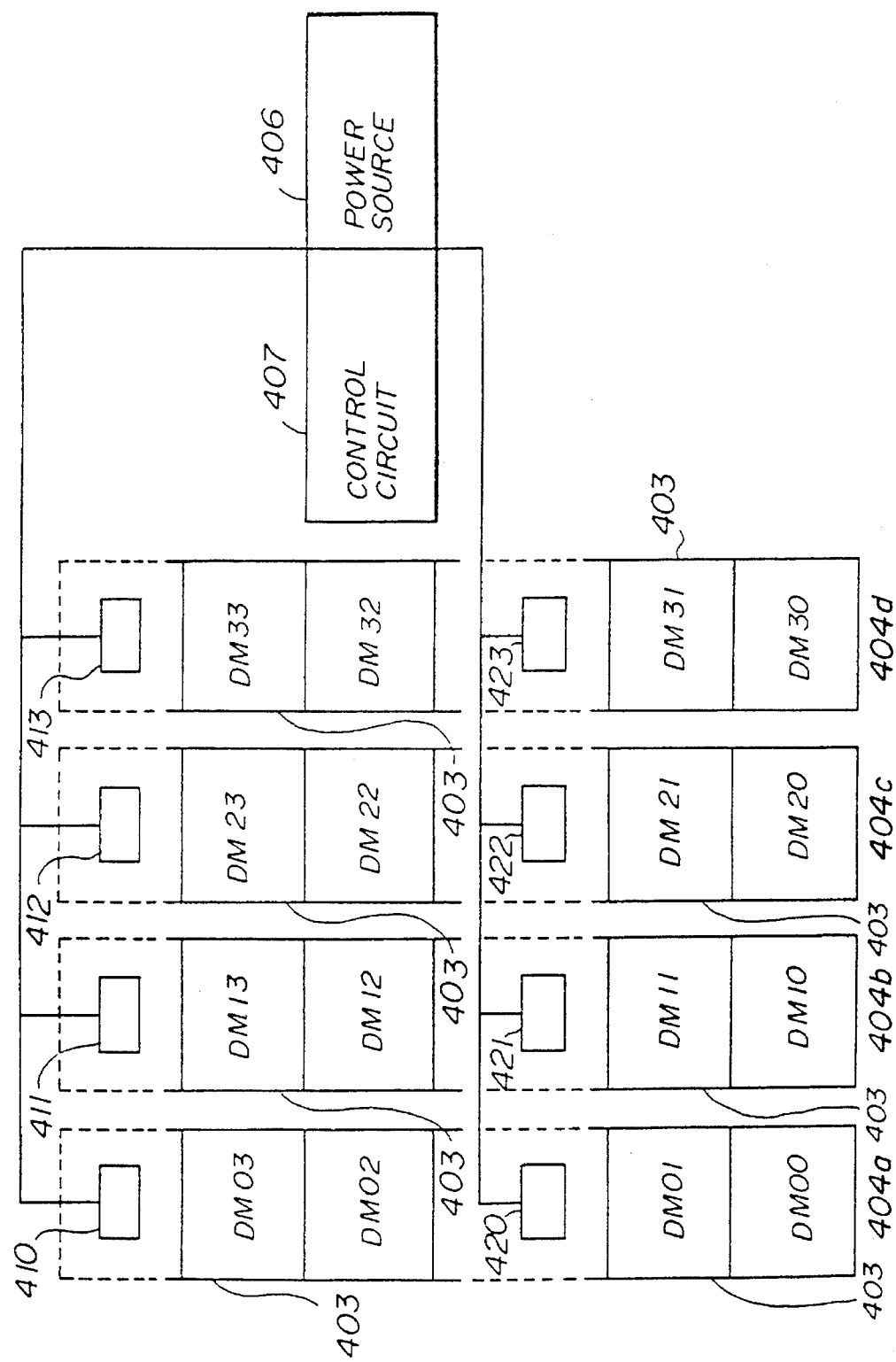
FIG. 29 is a diagram of a fourth embodiment of the present invention.

A description will now be given of a fourth preferred embodiment of the present invention. FIG. 29 is a block diagram of an outline of the fourth embodiment of the present invention. A plurality of storage disk modules 403 are arranged in a plurality of (four) unit module columns 404a, 404b, 404c and 404d. Each of the eight unit module columns is divided into an upper stage and a lower stage. Each of the unit module columns includes four storage disk modules. For example, the unit module column 404a includes four storage disk modules DM00, DM01, DM02 and DM03. A plurality of cooling fans are provided for each of the unit module columns. For example, two cooling fans 410 and 420 are arranged in the unit module column 404a. The cooling fan 410 is provided for the storage disk modules DM03 and DM02 located in the upper stage, and the cooling fan 420 is provided for the storage disk modules DM01 and DM00 in the lower stage.

A control circuit 407 supervises the operating states of the cooling fans 410–413 and 420–423 and controls them on the basis of the operating states thereof. A power source 406 supplies the cooling fans 410–413 and 420–423. If the control circuit 407 detects a fault, which has occurred in any of the cooling fans 410–413 and 420–423, the control circuit 407 controls, for example, the other cooling fan in the same column as that in which the cooling fan having a fault is located so that it rotates at an increased speed.

Figure 30:
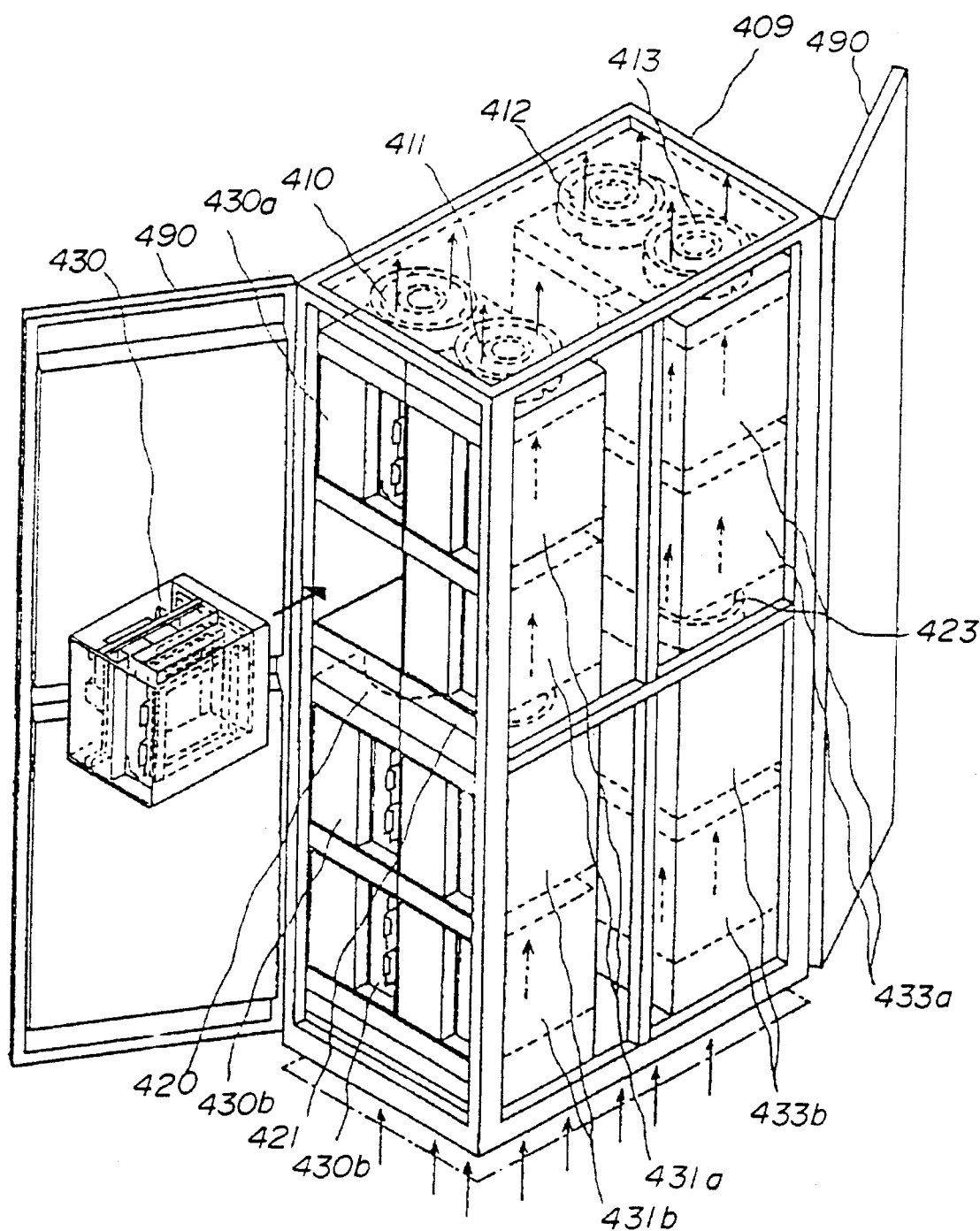
FIGS. 30 and 31 are perspective views of a storage disk device according to the fourth embodiment of the present invention.

FIGS. 30 through 36 are diagrams showing the fourth preferred embodiment of the present invention in more detail. As shown in FIG. 30, the storage disk device has four unit module columns 404a, 404b, 404c and 404d, each of which has the upper stage and the lower stage. The cooling fan 410 is provided for two storage disk modules 430a, and the cooling fan 411 is provided for two storage disk modules 431a. The cooling fan 412 is provided for two storage disk modules 432a, and the cooling fan 413 is provided for two storage disk modules 433a. The cooling fan 420 is provided for two storage disk modules 430b, and the cooling fan 421 is provided for two storage disk modules 431b. The cooling fan 422 is provided for two storage disk modules 432b, and the cooling fan 423 is provided for two storage disk modules 433b.

Each of the unit module columns 404a–404d has a duct structure, and is equipped with two cooling fans. The flow of air generated by the cooling fans 410–413 and 420–423 is indicated by arrows shown in FIG. 30. The storage disk modules 430a, 430b, 431a and 431b are inserted into a locker 409 via a front opening thereof so that the front surfaces thereof are exposed through the front opening. The storage disk modules 432a, 432b, 433a and 433b are inserted into the locker 409 through a back opening thereof so that the front surfaces thereof are exposed via the back opening. The front opening can be closed by a front door 490, and the back opening can be closed by a back door 490. It will be noted that the duct structure of each of the unit module columns can be established in a state where some of the modules have not been inserted into the locker 409.

Figure 31:
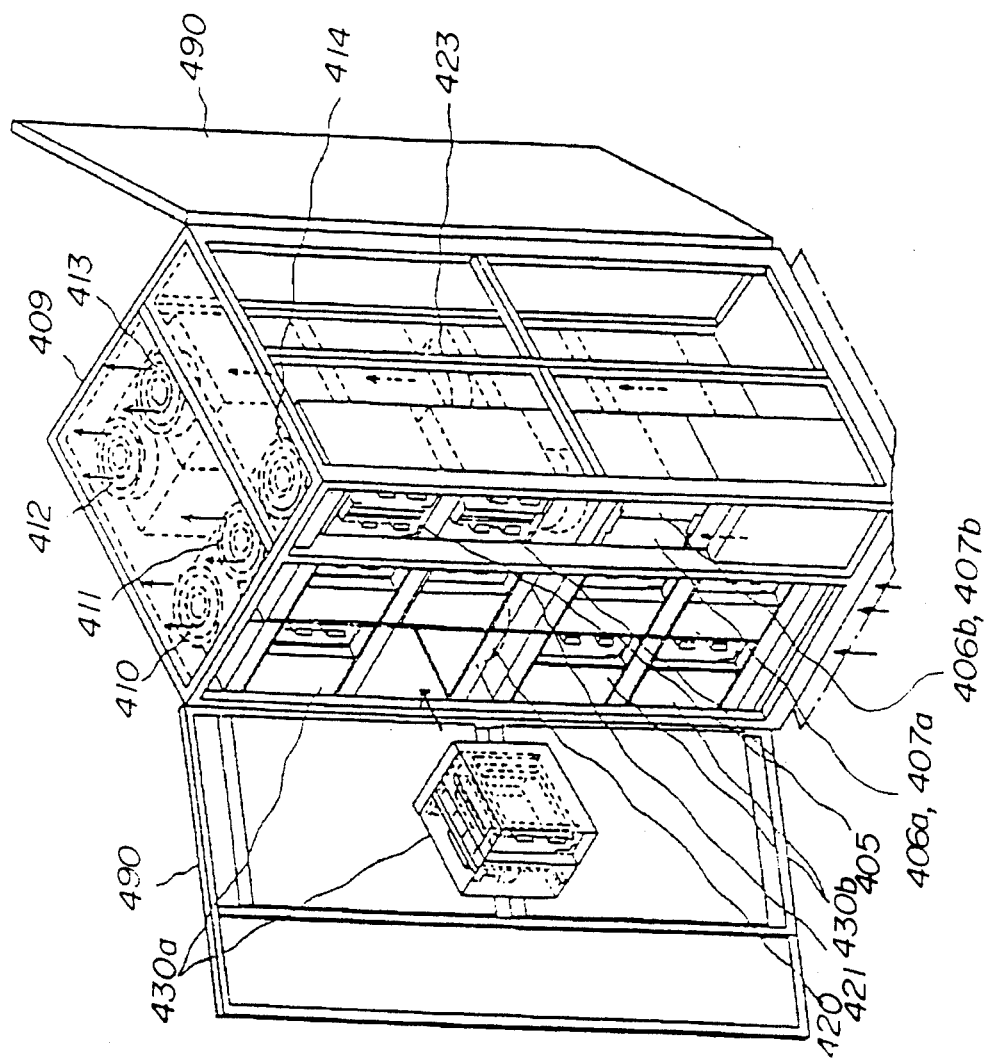

The storage disk device shown in FIG. 30 is a slave type storage disk device. FIG. 31 shows a master type storage disk device, which has, in addition to the structural elements of the slave type storage disk device shown in FIG. 30, a string control circuit 405, a first system composed of a power source 406a and a control circuit 407a, and a second system composed of a power source 406b and a control circuit 407b. The slave type storage disk device is supplied with electricity from the master type storage disk device.

Figure 32:
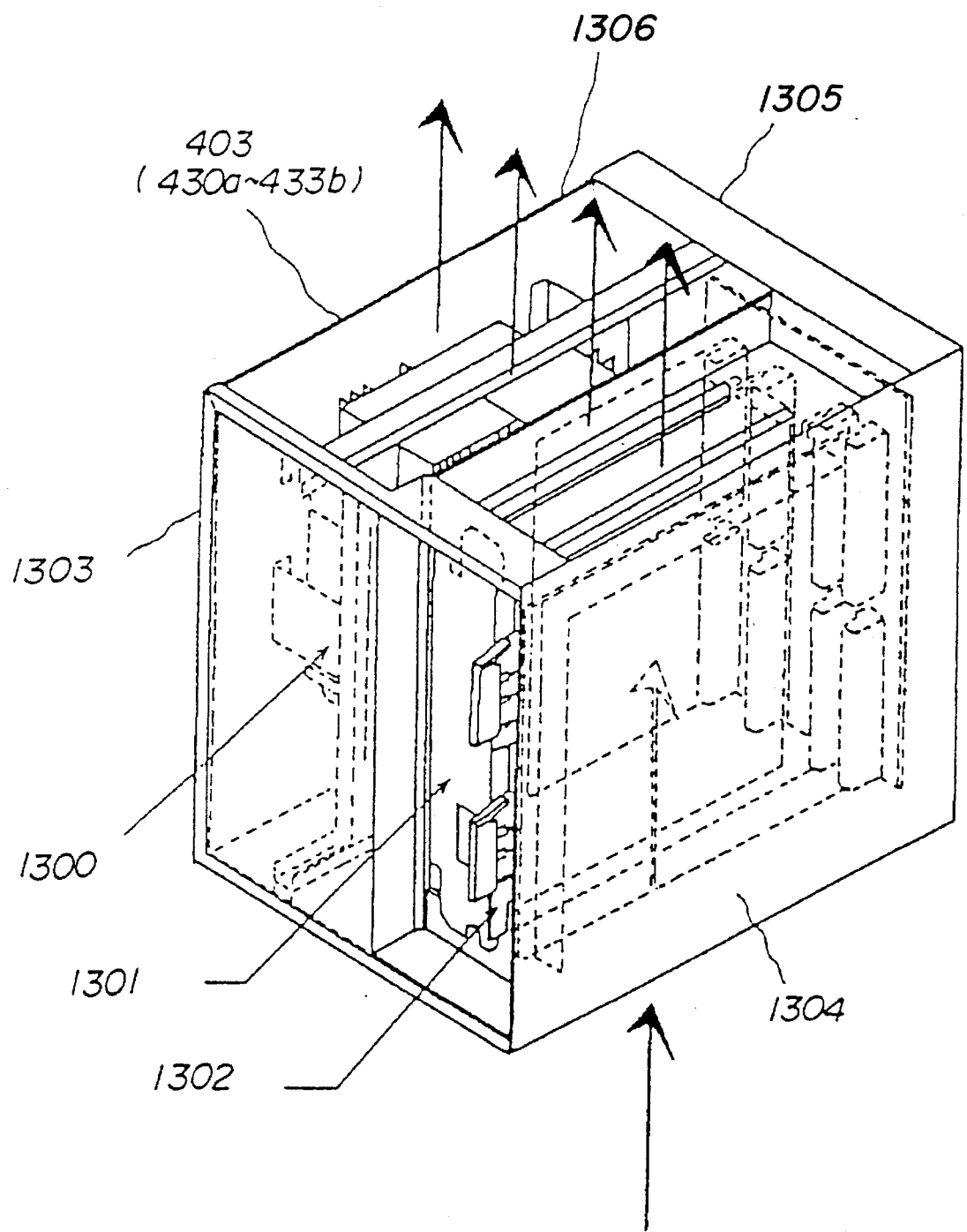
FIG. 32 is a perspective view of a storage disk module used in the fourth embodiment of the present invention.

As shown in FIG. 32, each of the storage disk modules 403 (430a–433b) has side plates 1303 and 1304, and a back plate 1305, all of which are accommodated in a frame 1306. This frame 1306 has an upper opening and a lower opening. Further, a disk drive unit 1300, a power supply 1301 for the module, and a circuit unit 1302, which are arranged side by side, are accommodated in the frame 1306.

Figure 33:
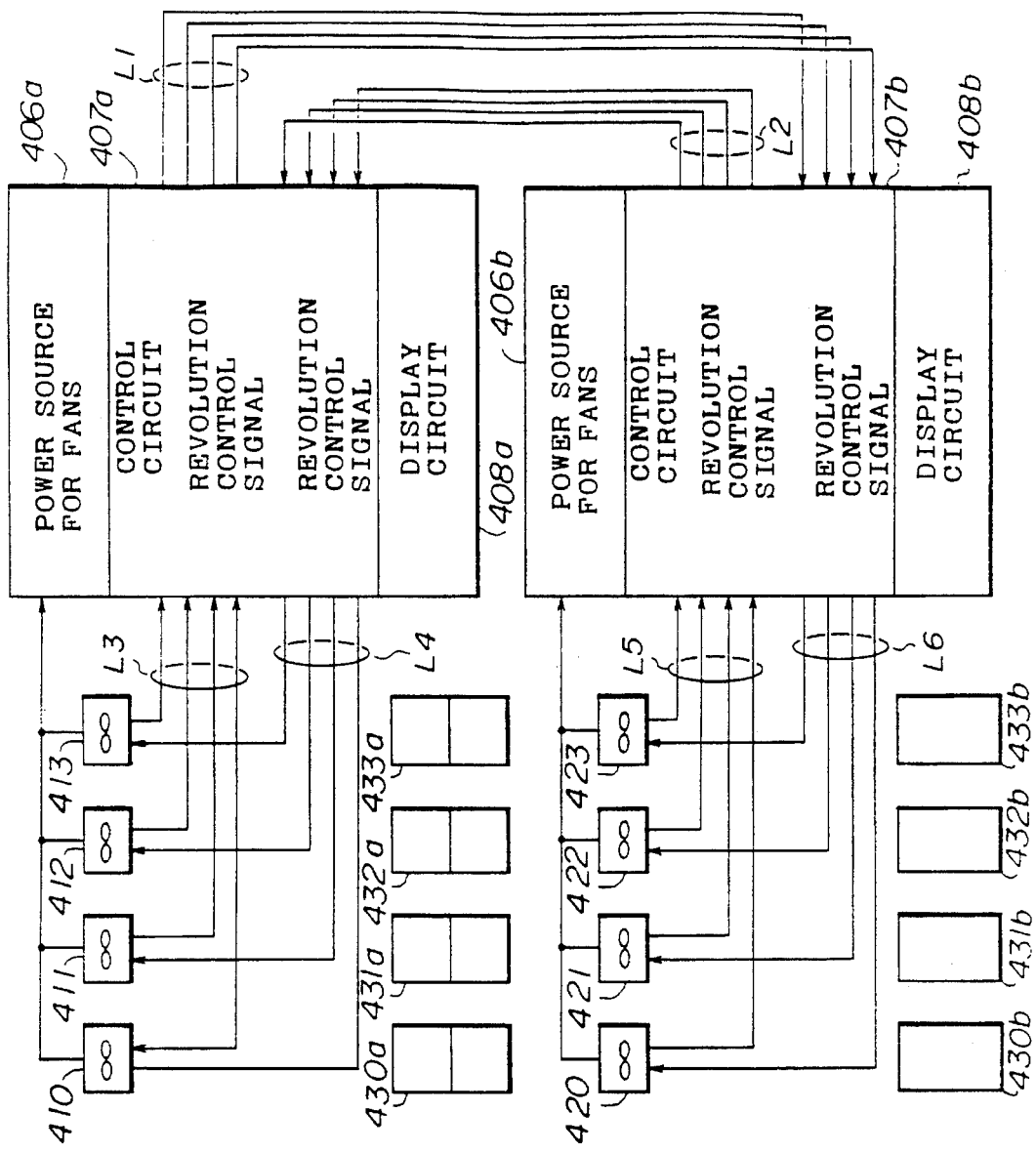
FIG. 33 is a diagram of an electrical system of the fourth embodiment of the present invention.
Figure 34:
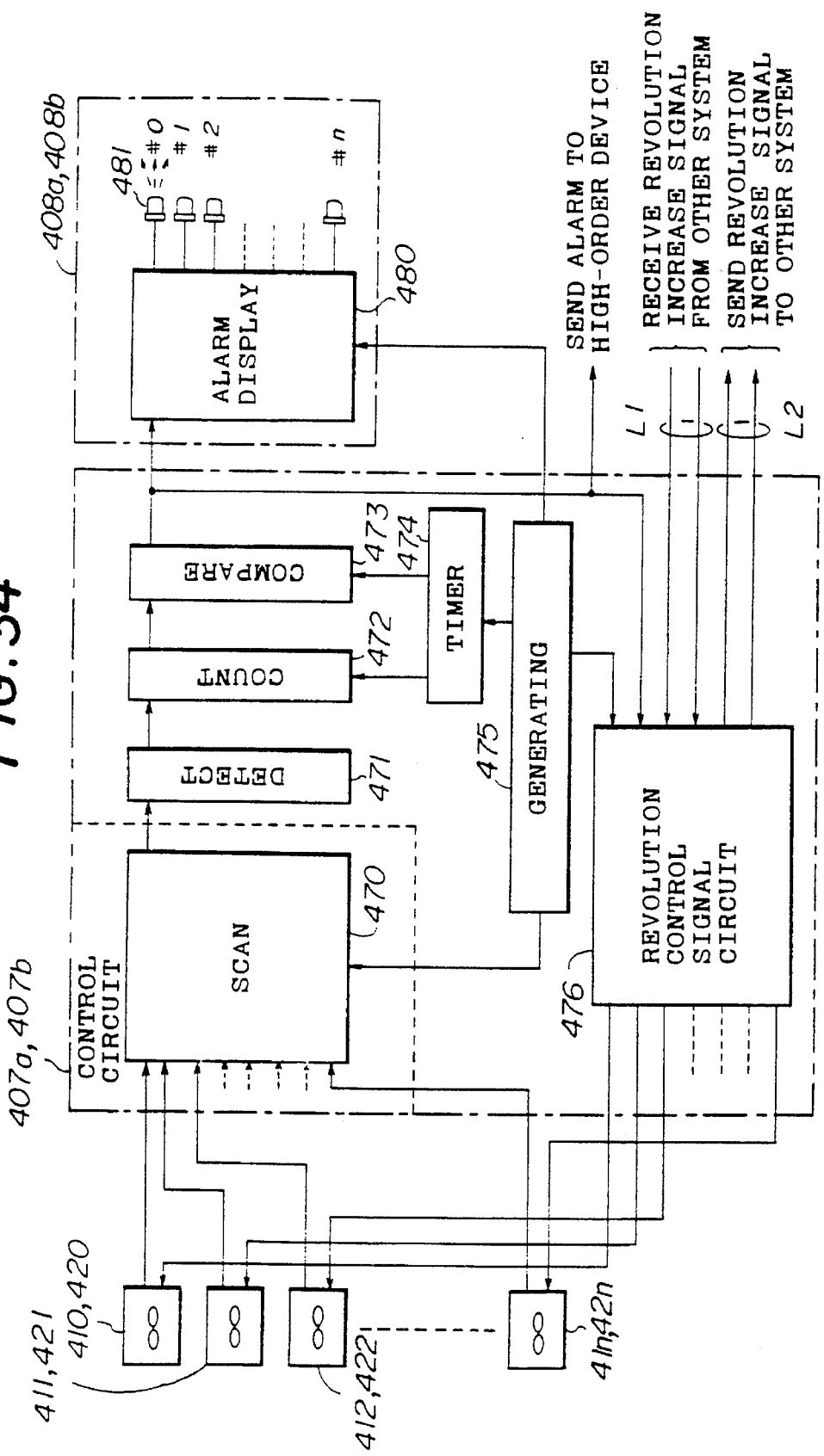
FIG. 34 is a diagram of each of two control circuits shown in FIG. 33.
Figure 35:
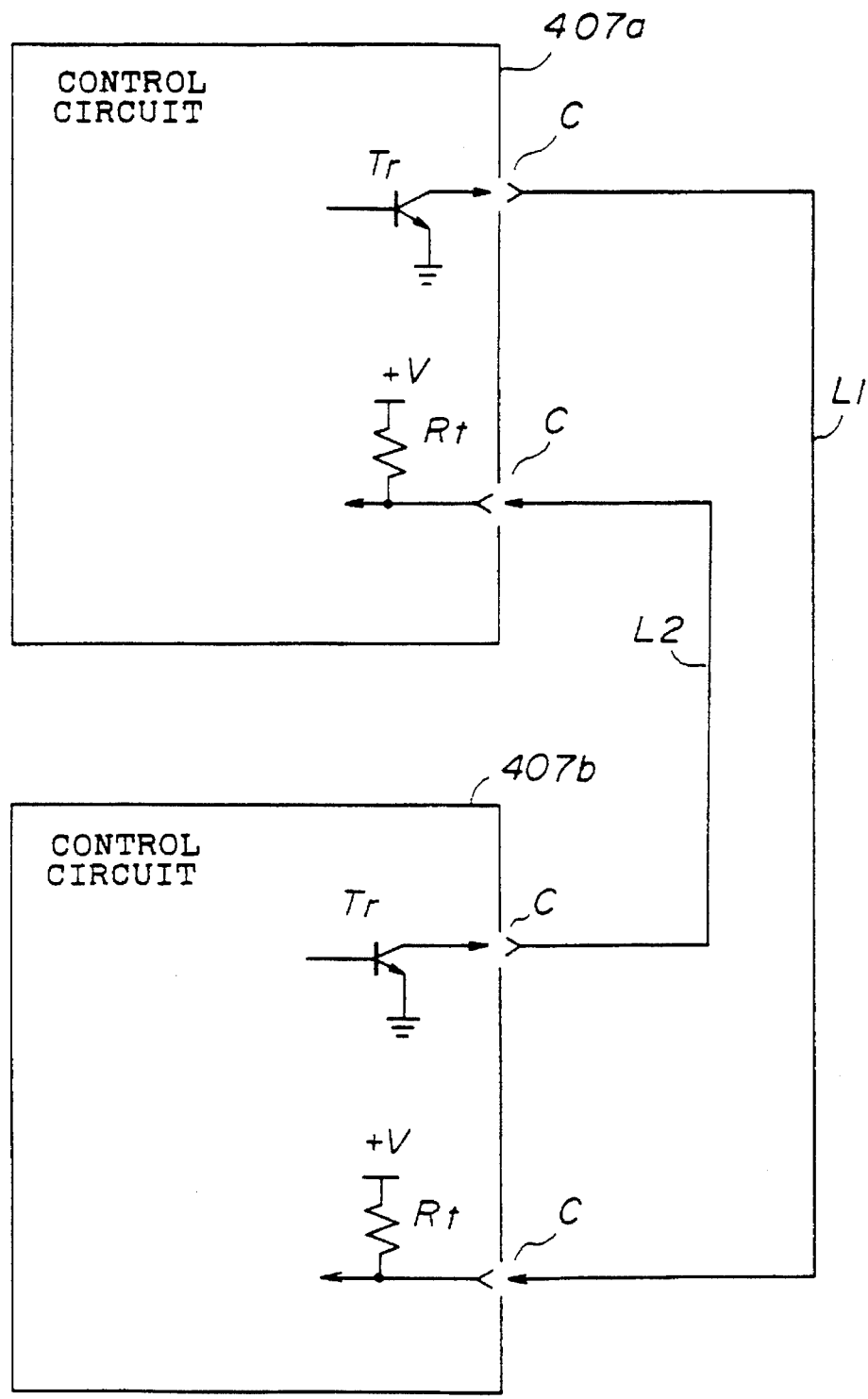
FIG. 35 is a circuit diagram of a cooling fan control structure used in the fourth embodiment of the present invention.

FIGS. 33 through 35 are block diagrams of an electrical system of the fourth embodiment of the present invention. Each of the cooling fans 410–413 and 420–423 is formed with a DC brushless motor, which has, for example, two switchable revolutions controlled by a control signal. Two revolution pulses (revolution detection signal) synchronized with revolutions of the motor are generated per one revolution.

Each of the cooling fans 410–413 is supplied with +24 V through a power supply line extending from the power source 406a. Each of the cooling fans 420–423 is supplied with +24 V through a power supply line extending from the power source 406b.

The control circuit 407a is connected to the cooling fans 410–413 through revolution detection lines L3 and revolution control lines L4. The control circuit 407a receives the revolution detection signals from the cooling fans 410–413 via the lines L3, and compares the number of revolutions of each of the cooling fans 410–413 with a predetermined number of revolutions. If the number of revolutions of one of the cooling fans 410–413 becomes smaller than the predetermined number of revolutions, the control circuit 407a outputs a revolution increasing signal to the control circuit 407b through lines L1. If the control circuit 407a receives a revolution increasing signal from the control circuit 407b in the same manner as described above, it controls the cooling fans 410–413 through the lines L4 so that they rotate at an increased revolution.

The control circuit 407b is connected to the cooling fans 420–423 through revolution detection lines L5 and revolution control lines L6. The control circuit 407b receives the revolution detection signals from the cooling fans 420–423 through the lines L5, and compares the number of revolutions of each of the cooling fans 420–423 with a predetermined number of revolutions. If the number of revolutions of one of the cooling fans 420–423 becomes smaller than the predetermined number of revolutions, the control circuit 407b transmits a revolution increasing signal to the control circuit 407b through lines L2. If the control circuit 407b receives a revolution increasing signal from the control circuit 407a in the same manner as described above, it controls the cooling fans 420–423 through the lines L6 so that they rotate at an increased revolution.

Each of the control circuits 407a and 408b transmits an alarm signal to a storage device control device or a CPU (not shown) and notifies it of the occurrence of a fault. If the maintenance operator recognizes the occurrence of the fault, the operator resets the storage disk module having the fault by, for example, a switch.

As shown in FIG. 34, the storage disk device includes two display circuits 407a and 407b, each of which an alarm display circuit 480 and indicators 481.

The indicators 481 correspond to the cooling fans 410–41n (420–42n). The indicator 481 corresponding to a defective cooling fan is turned ON.

Each of the control circuits 407a and 407b has a scan circuit 470, a revolution pulse detection circuit 471, a counter circuit 472, and a comparator circuit 473. The scan circuit 470 scans the revolution detection lines L3 connected to the cooling fans 410–41n (420–42n). The revolution pulse detection circuit 471 detects a revolution pulse output by the scan circuit 470. The counter circuit 472 counts the number of detection pulses output by the revolution pulse detection circuit 471. The comparator circuit 473 compares the counter value of the counter circuit 472 with a reference value (reference revolution number) and generates an alarm signal if the counter value becomes smaller than the reference value.

Further, each of the control circuits 407a and 407b includes a timer 474, a select signal generating circuit 475, a revolution control signal generating circuit 476. The timer 474 makes the counter circuit 472 count the number of pulses during a predetermined period (for example, 1 second) and makes the comparator 473 compare the counter value with the reference value. The select signal generating circuit 475 outputs respective select signals to the scan circuit 470, the timer 474, the alarm display circuit 480 and the revolution control signal generating circuit 476. The circuit 476 is connected to the lines L1 extending from the other system and the lines L2 extending to the other system. In response to the alarm signal, the circuit 476 sends the revolution increase signal to the other system through one of the lines L2 related to a defective storage disk-module in the other system, and sends the revolution increase signal received through one of the lines L1 to the corresponding storage disk module.

All of the revolution pulse detection circuit 471, the counter circuit 472, the comparator circuit 473, the timer 474, the select signal generating circuit 475, the revolution control signal generating circuit 476 are formed with a microprocessor.

As shown in FIG. 35, each of the lines L1 is connected between the control circuits 407a and 407b through connectors C, and each of the lines L2 is connected between the control circuits 407a and 407b through connectors C. A driver provided in each of the control circuits 407a and 407b is formed with an open-collector transistor Tr, and a receiver provided therein is formed of a resistor Rt connected to the +V power source. If each of the lines L1 and L2 does not indicate an increase in the number of revolution, a potential is applied to the base of the transistor Tr. as a result, the transistor Tr is turned ON, and the receiver is set to the low level. If each of the lines L1 and L2 indicates an increase in the number of revolutions, the transistor Tr is not biased, and hence turned OFF. As a result, the receiver is set to the high level. With this structure, it becomes possible to maintain the high-level revolution increase signal even if the power source and the control circuit are detached and thus the driver is opened.

Figure 36:
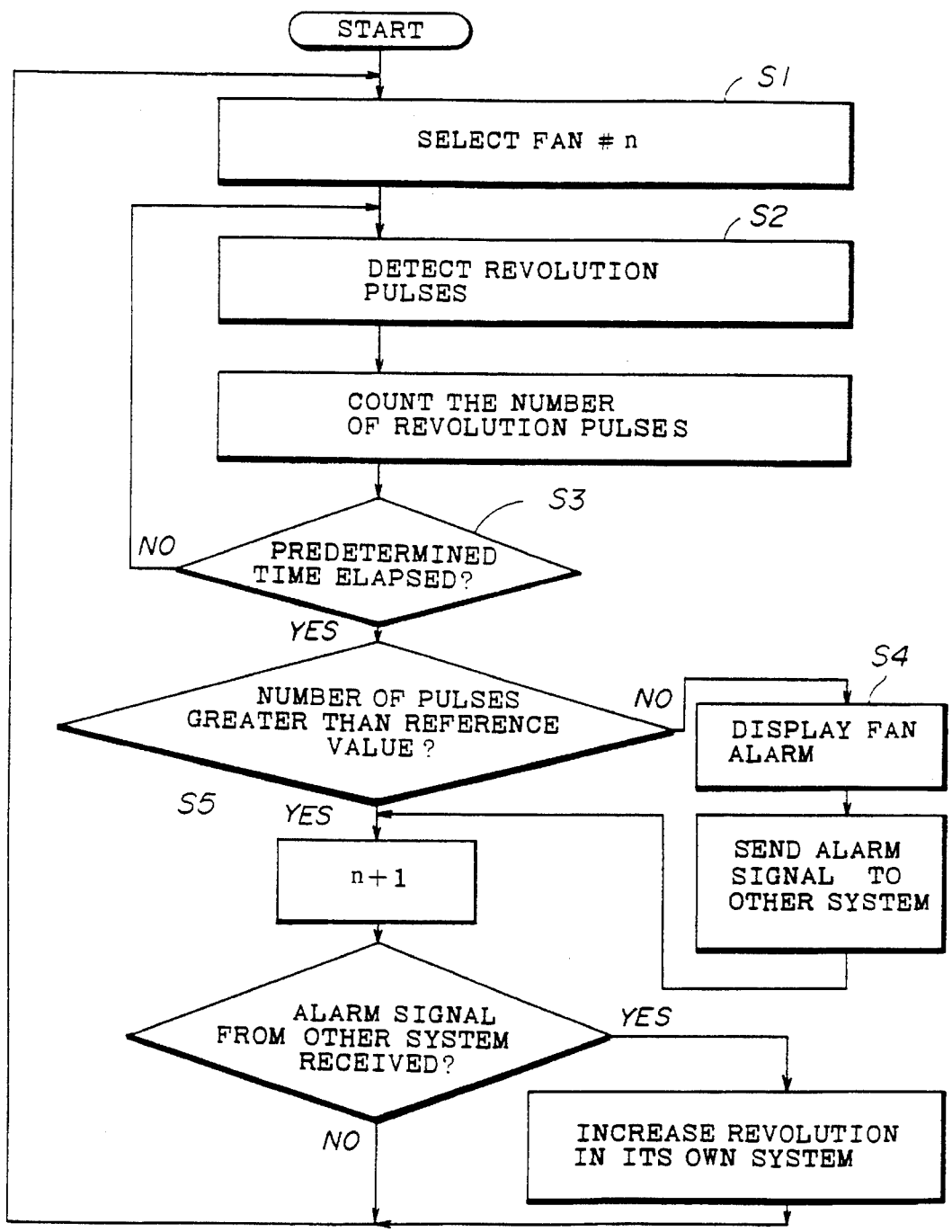
FIG. 36 is a flowchart of a cooling fan control procedure used in the fourth embodiment of the present invention.

FIG. 36 is a flowchart of a fan control procedure. At step S1, the select signal generating circuit selects cooling fan #m and informs the scan circuit 470, the timer 474, the alarm display circuit 480 and the revolution control signal generating circuit 476 of this selection. The scan circuit 470 selects the cooling fan #n. The timer 474 is activated. The counter circuit 472 starts the count operation. At step S2, the revolution pulse detection circuit 471 detects revolution pulses, the number of which is counted by the counter circuit 472.

At step S3, if the time measured by the timer 474 has not yet become to the predetermined time (for example, one second), step S2 is executed. If the predetermined time has elapsed, the counter circuit 472 stops counting, and the comparator circuit 473 compares the number of revolution pulses counted by the counter circuit 472 with the reference value (equal to, for example, 70) in order to determined whether or not the number of pulses is equal to or greater than the reference value.

If it is determined, at step S4, that the counter value is smaller than the reference value, it is recognized that a fault has occurred in the cooling fan #n and the alarm signal is generated. If the counter value is equal to 100 for the normal operation of the cooling fan, it is recognized that a fault has occurred in the cooling fan if the counter value is less than 70. If the alarm signal is generated, the alarm control circuit 480 turns ON the indicator 481 corresponding to the defective fan. The high-order device is informed of the occurrence of the alarm. In accordance with the select signal generated by the select signal generating circuit 475, the revolution control signal generating circuit 476 sends the revolution increase signal to the corresponding one of the fan control lines L2. Then, the procedure returns step S1.

Step S5 is executed if the number of evolution pulses is greater than the reference value or after step S4 is executed. At step S5, the select signal generating circuit 475 increments the fan number by 1. The revolution control signal generating circuit 476 determines whether or not the revolution increase signal is received from the other system through the corresponding one of the fan control lines L1. If the result of this determination is NO, the procedure returns step S1. If the result is YES, the revolution control signal generating circuit 476 outputs the revolution increase signal to the corresponding cooling line through one of the lines L4 (L6).

Referring again to FIG.33, a description will now be given of an operation executed if a fault occurs in a cooling fan and an operation executed until the defective cooling fan is repaired. For example, if the revolution of the cooling fan 410 located in the upper stage of the locker 409 decreases due to a cause, such as consumption of grease in a bearing, the period of the revolution pulse is lengthened. The control circuit 407a detects this change, and sends, to the control circuit 407b through the corresponding fan control line L1, the revolution increase signal related to the corresponding cooling fan 420 located in the lower stage. The control circuit 407b receives the revolution increase signal and instructs the cooling fan 420 to rotate at an increased speed.

The control circuit 407a sends to a high-order device, such as a storage disk control device or a CPU, the alarm signal, and makes the display circuit 408a indicate the occurrence of the alarm. The maintenance operator identifies the defective cooling fan on the basis of the alarm signal sent to the high-order device and the indication of the display device 408a. In response, the maintenance operator replaces the detective cooling with a new one. If the defective cooling fan has been detached, the control circuit continuously detects the revolution pulses of the already detached fan. Thus, the alarm state can be continuously maintained, and the corresponding fan of the other system operates at an increased revolution.

After the new cooling fan is placed in position, supply of electricity to the new cooling fan restarts and the revolution thereof reaches the reference value, the revolution increase signal is stopped, and the normal operation is executed.

A description will now be given of an operation executed if a fault occurs in the power source for the fans and an operation executed until the defective power source is replaced by a new one. A single power source for the fans can be used. However, in the present embodiment of the invention, duplexed power sources are used.

If a fault, such as an excessive current or an excessive voltage, has occurred in the power source 406a for the fans in the upper stage, the control circuit 407a outputs an alarm signal to the high-order device, and sends a display signal to the display circuit 408a. Then, the control circuit 407a disconnects the defective power source 406a from the storage disk device. It will be noted that the display circuit 408a is driven by another power source.

As shown in FIG. 35, the transistor Tr is turned OFF by disconnecting the power source 406a from the electrical system. Hence, the revolution increase signals are sent to all the fan control lines L1, and all the cooling fans 410–413 stop to operate. However, the cooling fans 420–423 for the other system start to rotate at an increased revolution. The maintenance operator identifies the defective power source 406a from the alarm signal sent to the high-order device and indication on the display circuit 408a. Then, the maintenance operator replaces the defective power source 406a with a new one. Then, the new power source 406a is turned ON. If the number of revolutions of each of the cooling fans 410–413 becomes equal to the reference value, supply of the revolution increase signals to the cooling fans 420–423 are stopped. In this structure, each of the power sources 406a and 406b has a capacity enough to drive one system (fans located in the upper or lower stage).

In the above-mentioned manner, the cooling fans 410–413 and 420–423 can be controlled separately from each other. Hence, back-up control can be established for each of the unit module columns 404a–404d. The present back-up control does not generate large noise and a large amount of energy, and does not have excessive cooling.

The fan control system has high reliability because a plurality of control circuits (control circuits 407a and 407b) are used, that is, the control system is decentralized. In addition, the power source system is decentralized and thus has high reliability.

Figure 37:
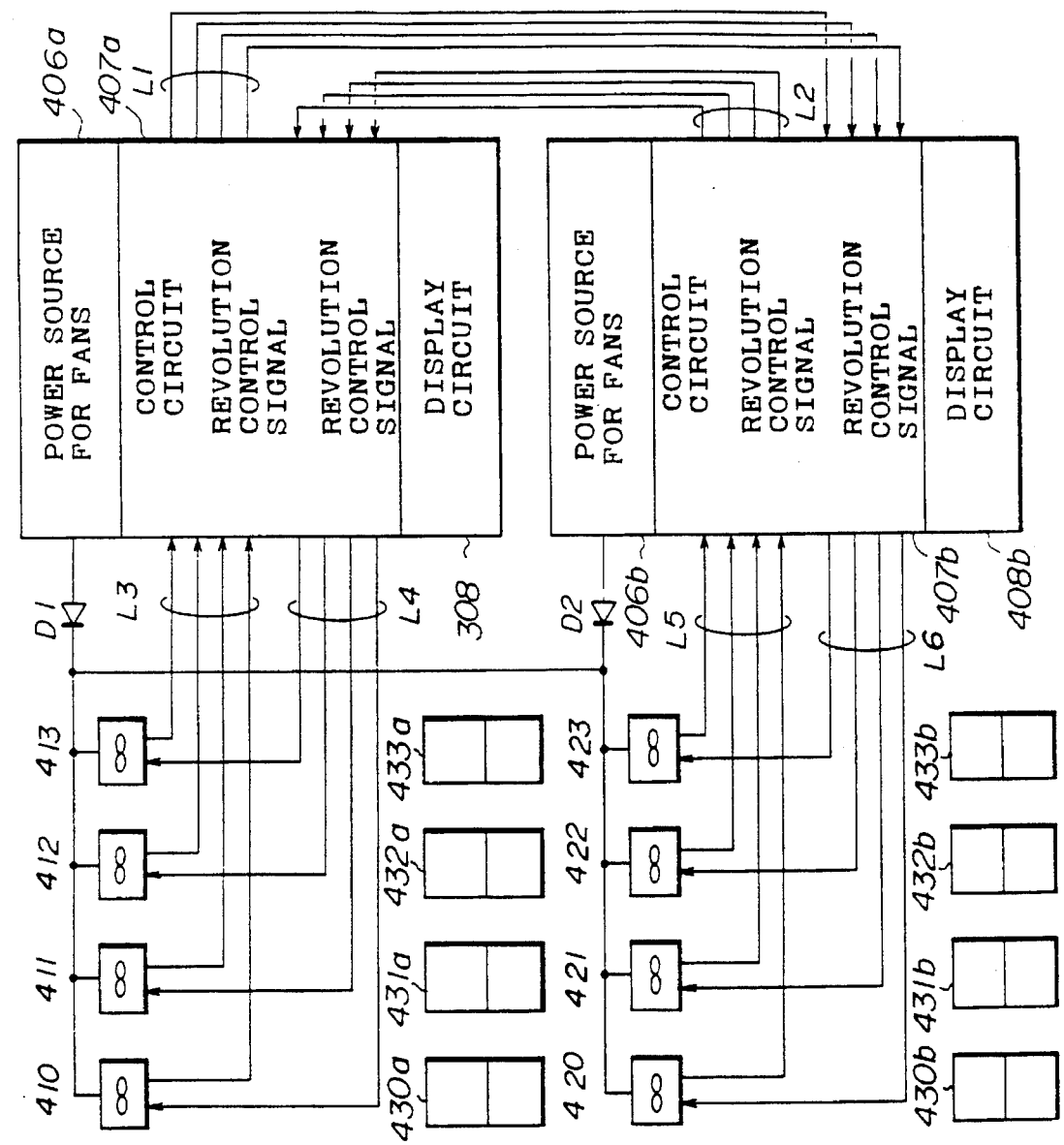
FIG. 37 is a diagram of a variation of the structure shown in FIG. 33.

FIG. 37 is a block diagram of a variation of the structure shown in FIG. 33. A diode D1 is connected between the power source 406a and each of the cooling fans 410–413, and a diode D2 is connected between the power source 406b and each of the cooling fans 420–423. If the power source 406a has a fault, the power source 406b supplies the cooling fans 410–413 with electricity. In this case, the defective power source 406a is disconnected from the cooling fans 410–413 by the diode D1. Hence, the cooling fans 410–413 continuously operate. It is not necessary to increase the revolution of each of the cooling fans 420–423.

Figure 38:
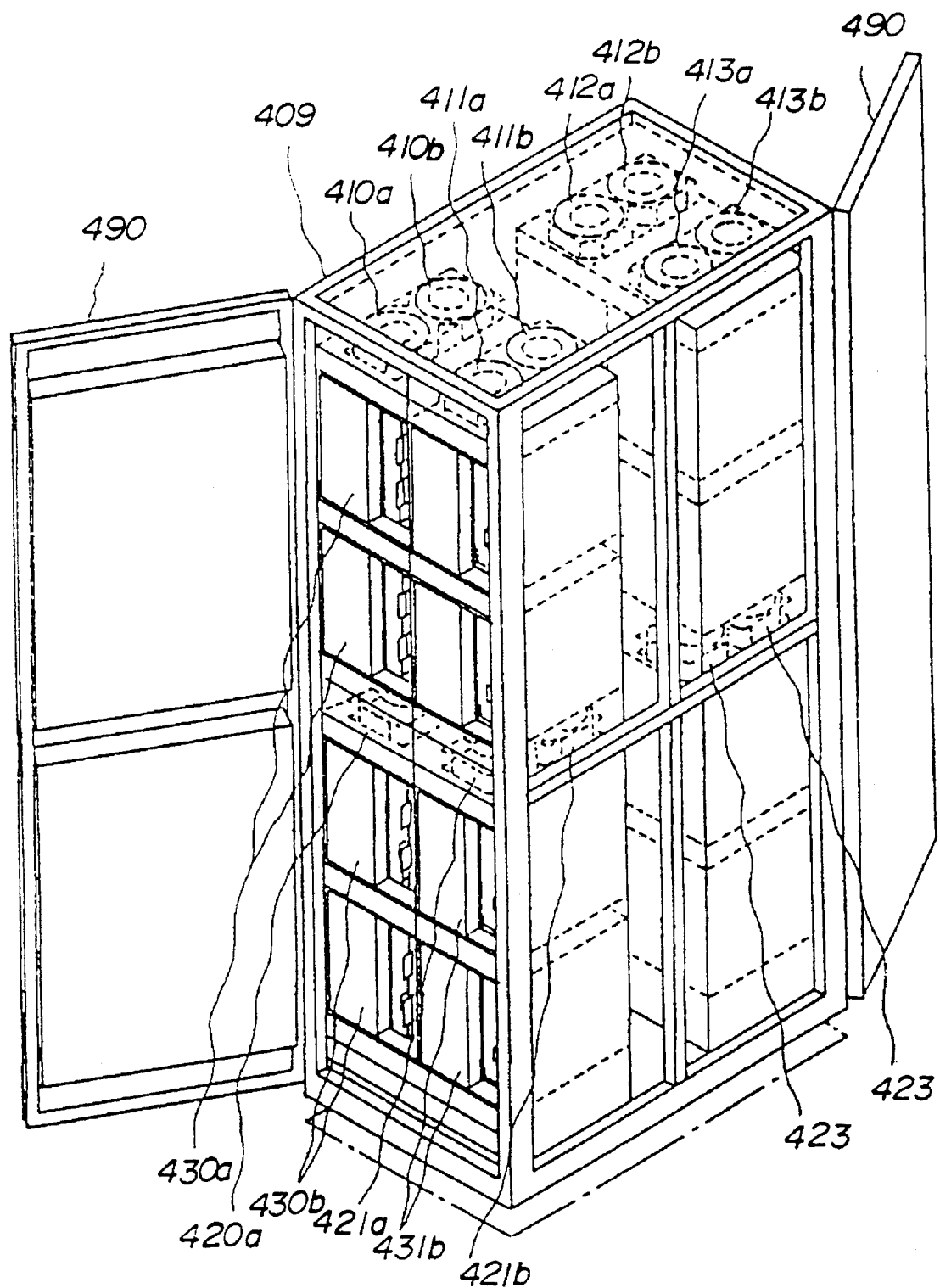
FIG. 38 is a diagram of a perspective view of a variation of the structure shown in FIG. 30.

FIG. 38 is a perspective view of a variation of the structure shown in FIG. 31. The storage disk device shown in FIG. 38 includes cooling fans 410a, 410b, 411a, 411b, 412a, 412b, 413a, 413b, 414a, 414b, 420a, 420b, 421a, 421b, 422a, 422b, 423a and 423b. The cooling fans 410a and 410b are substituted for the cooling fan 410 shown in FIG. 31. That is, two cooling fans are provided for two storage disk modules elevationally stacked. If one of the two cooling fans becomes defective, the other cooling fans is controlled so that it rotates at an increased revolution. If a cooling fan becomes defective, the other cooling fans located in the same unit module column as the defective cooling fan are controlled so as to operate at an increased revolution.

Further, variations of the above-mentioned embodiments of the present invention can be made. It is possible to use a cooling device other than the cooling fan, such as a blower. The number of unit module columns is limited to four, and the number of storage disk modules in each of the unit module columns is not limited to four. It is possible to use a plurality of reference values based on revolution modes of the cooling fan. It is possible to control the fans at three or more revolutions. It is possible to add a temperature control mechanism in which a temperature sensor is provided at an appropriate position in the locker 409 and the revolution of each fan can be additionally controlled by the measured temperature.

The present invention is not limited to the specifically disclosed embodiments, and variations and modifications may be made without departing from the scope of the present invention.

What is claimed is:

1. A storage disk device comprising:

a locker; and a plurality of storage disk modules accommodated in said locker, each of said storage disk modules comprising:
   a frame having front and back portions;
   a disk drive unit having a storage disk, said disk drive unit being accommodated in said frame;
   a circuit unit which controls said disk drive unit, said circuit unit being accommodated in said frame;
   a power source unit which supplies said disk drive unit and said circuit unit with electrical energy, said power source unit being accommodated in said frame;

said disk drive unit, said circuit unit and said power source unit each having corresponding front and back portions and being slidingly insertable in a first direction into said frame in substantially parallel, side by side relationship with respect to each other so that the back portion of each unit is opposite to the back portion of the frame; and a back panel mounted in the back portion of said frame and extending transversely to the first direction, said back panel having a front surface and electrically connecting said disk drive unit, said circuit unit and said power source unit to each other.

2. The storage disk device as claimed in claim 1, wherein:

said locker has a front opening and a back opening;

a first one of said storage disk modules is inserted into said locker through said front opening;

a second one of said storage disk modules is inserted into said locker through said back opening; and said first one of said storage disk modules and said second one of said storage disk modules each have a back surface wherein said back surface of said first one of said storage disk modules is adjacent to that of said back surface of said second one of said storage disk modules in said locker.

3. A storage disk device as claimed in claim 1, wherein:

each of said storage disk modules comprises a connector mounted on a front end of said circuit unit; and said connector of one of the storage disk modules is connected, via a cable, to a string controller.

4. A storage disk device as claimed in claim 1, wherein:

each of said storage disk modules comprises a first connector mounted on a back surface of said back panel;

said storage disk device comprises a second connector attached to said locker; and said first connector engages with said second connector.

5. The storage disk device as claimed in claim 1, wherein:

said disk drive unit of each of said storage disk modules comprises a first connector;

said circuit unit of each of said storage disk modules comprises a second connector;

said power source unit of each of said storage disk modules comprises a third connector; and each of said storage disk modules comprises fourth connectors mounted on the front surface of said back panel, said fourth connectors engaging with said first, second and third connectors.

6. A storage disk device as claimed in claim 5, wherein:

each of said storage disk modules comprises fifth connectors mounted on a back surface of said back panel;

said fifth connectors are electrically connected to said fourth connectors; and said locker comprises sixth connectors engaged with and connected to said fifth connectors.

7. A storage disk device as claimed in claim 6, wherein:

said locker comprises a projection on which said sixth connectors related to each of said storage disk modules are mounted;

said frame of each of said storage disk modules has a recess in which said fifth connectors are located; and said projection is fitted into said recess so that the fifth connectors engage with the sixth connectors.

8. A storage disk device as claimed in claim 1, wherein:

said storage disk modules are arranged in columns;

said frame of each of said storage disk modules has an upper opening and a lower opening; and the storage disk modules located in an identical column form a duct structure through which air flows.

9. A storage disk device as claimed in claim 8, wherein:

each of said storage disk modules has a front opening; and said storage disk device comprises a first door closing a front opening of said locker, and a second door closing a back opening of said locker.

10. The storage disk device as claimed in claim 1, wherein:

each of said storage disk modules comprises a first accommodation area in which said disk drive unit is accommodated, and a second accommodation area in which said circuit unit and said power source unit are accommodated, said first accommodation area has a depth different from that of said second accommodation area; and a first one of said storage disk modules and a second one of said storage disk modules are arranged so that the first accommodation area of said first one of said storage disk modules is opposed to said second accommodation area of said second one of said storage disk modules.

11. A storage disk device as claimed in claim 1, wherein:

the storage disk modules are arranged in N columns, each of the N columns including storage disk modules where N is smaller than a total number of said storage disk modules;

said storage disk device comprises module cooling means, provided for each of the columns, for cooling said storage disk modules.

12. A storage disk device as claimed in claim 11, wherein:

said module cooling means comprises M cooling devices provided for each of the N columns where M is an integer larger than one; and said storage disk device comprises control means for detecting a fault in the M cooling devices provided for each of the N columns and for increasing a revolution of a first one of the M cooling devices provided for each of the N columns when the fault has occurred in a second one of the M cooling devices provided in a same column as said first one of the M cooling devices.

13. A storage disk device as claimed in claim 12, wherein each of said M cooling devices is a cooling fan.

14. A storage disk device as claimed in claim 12, wherein said control means comprises scan means for sequentially supervising the M cooling devices provided for each of the N columns.

15. A storage disk device as claimed in claim 1, wherein said storage disk modules are grouped into N groups where N is an integer, wherein said storage disk device comprises:

a plurality of cooling devices for each of the N groups; and a plurality of control means, provided for the N groups, for separately scanning the cooling devices in the N groups in order to detect a fault in the cooling devices in the N groups and for increasing, when the fault has occurred in one of the cooling devices, a cooling ability of a different one of the cooling devices provided in a same column as said one of the cooling devices having the fault.

16. A storage disk device as claimed in claim 15, wherein each of said plurality of control means sequentially accesses the cooling devices in a corresponding one of the N groups.

17. A storage disk device as claimed in claim 1, wherein said storage disk device comprises:

a plurality of cooling devices grouped into a plurality of groups; and a plurality of power sources for separately supplying the cooling devices with energy.

18. A storage disk device as claimed in claim 17, wherein said storage disk device comprises control means for detecting a fault in the power sources and for supplying, if it is detected that one of the power sources has the fault, the cooling devices connected to said one of the power sources with energy from a different one of the power sources.

19. A storage disk device as claimed in claim 1, wherein:

the storage disk modules are arranged in columns;

a plurality of cooling devices are provided for each of the columns; and the cooling devices are located at upper and intermediate portions of each of the columns.

20. The storage disk device as claimed in claim 1, wherein:

said frame has a guide member;

said disk drive unit of each of said storage disk modules has a drive unit frame member, said drive unit frame member of said disk drive unit is inserted into said guide member of said frame and is slidable with respect to said guide member.

21. The storage disk device as claimed in claim 20, wherein said disk drive unit further comprises:

a main body in which said storage disk is accommodated;

a vibration absorbing member; and said vibration absorbing member is interposed between said main body and said drive unit frame member.

22. The storage disk device as claimed in claim 1, wherein:

said frame has a circuit unit guide member; and said circuit unit engages with said circuit unit guide member and is slidable with respect to said circuit unit guide member.

23. The storage disk device as claimed in claim 1, wherein:

said frame has a power source guide member; and said power source unit engages with said power source guide member and is slidable with respect to said power source guide member.

24. The storage disk device as claimed in claim 1, wherein:

said disk drive unit comprises a first connector;

said circuit unit comprises a second connector;

said power source unit comprises a third connector; and said storage disk module comprises fourth connectors mounted on the front surface of said back panel, said fourth connectors engaging with said first, second and third connectors.

25. The storage disk device as claimed in claim 24, wherein said disk drive unit further comprises:

a printed circuit board having through holes;

a drive unit frame member having projections having screw holes;

said first connector is fixed to said printed circuit board; and said printed circuit board is secured to said projections by screws passing through said through holes and engaging said screw holes.

* * * * *

UNITED STATES PATENT AND TRADEMARK OFFICE
CERTIFICATE OF CORRECTION

PATENT NO. : 5,619,486

DATED : Apr. 8, 1997

INVENTOR(S) : UNO et al.

Page 1 of 2

It is certified that error appears in the above-indentified patent and that said Letters Patent is hereby corrected as shown below:

TITLE PAGE: [56] References Cited, delete contents entirely and insert the following:

U.S. PATENT DOCUMENTS

| | | | |
|---|---|---|---|
| 4,899,254 | 02/1990 | Ferchau et al. | 361/384 |
| 5,001,602 | 03/1991 | Suffi et al. | 361/390 |
| 5,173,819 | 12/1992 | Takahashi et al. | 360/97.03 |
| 5,206,772 | 04/1993 | Hirano et al. | 361/384 |

FOREIGN PATENT DOCUMENTS

| | | | |
|---|---|---|---|
| 0328260 | 08/1989 | European Patent Office | |
| 0335490 | 10/1989 | European Patent Office | |
| 62-243173 | 10/1987 | Japan | 360/97.02 |
| 62-271284 | 11/1987 | Japan | 360/97.02 |
| 02-266599 | 10/1990 | Japan | |
| 03-237675 | 10/1991 | Japan | 360/97.02 |

OTHER PUBLICATIONS

FUJITANI, L., "Laser Optical Disk: The Coming Revolution in On-Line Storage" *COMMUNICATIONS OF THE ASSOCIATION FOR COMPUTING MACHINERY*, Vol. 27, No. 6, Jun. 1984, New York, pgs. 546-554.

PATENT ABSTRACTS OF JAPAN, Vol. 12, No. 2 (P-652)(2849) Jan. 7, 1988 & JP-A-62 164 286 (HITACHI LTD.) Jul. 20, 1987, Abstract.

PATENT ABSTRACTS OF JAPAN, Vol. 14, No. 283 (P-1063)(4226) Jun. 19, 1990 & JP-A-2 083 883 (NEC CORP.) Mar. 23, 1990, Abstract.

PATENT ABSTRACTS OF JAPAN, Vol. 14, No. 308 (E-947) Jul. 3, 1990 & JP-A-2 098 197 (HITACHI LTD.) Apr. 10, 1990, Abstract.

UNITED STATES PATENT AND TRADEMARK OFFICE
CERTIFICATE OF CORRECTION

PATENT NO. : 5,619,486
DATED : Apr. 8, 1997
INVENTOR(S) : UNO et al.

It is certified that error appears in the above-indentified patent and that said Letters Patent is hereby corrected as shown below:

Col. 1,    line 59, delete "easily";
            line 60, after "ones", insert --easily--.

Col. 2,    line 61, delete "of the storage dish module".

Col. 7,    line 65, after "111" insert --.--.

Col. 13,   line 13, delete the paragraph indentation;
            line 61, change "revolution" to --revolutions--;
            line 62, change "as" to --As--.

Col. 14,   line 5, change "#m" to ----#n--;
            line 47, change "circuit 476 outputs" to --circuit 476 transmits--.

Col. 15,   line 3, after "cooling" insert --fan--.

Signed and Sealed this

Fifth Day of August, 1997

Attest:

BRUCE LEHMAN

Attesting Officer            Commissioner of Patents and Trademarks